(12) United States Patent
Zhang et al.

(10) Patent No.: US 12,224,854 B2
(45) Date of Patent: Feb. 11, 2025

(54) ENCODING AND DECODING METHOD AND APPARATUS

(71) Applicant: HUAWEI TECHNOLOGIES CO., LTD., Shenzhen (CN)

(72) Inventors: Huazi Zhang, Hangzhou (CN); Rong Li, Boulogne Billancourt (FR); Jiajie Tong, Hangzhou (CN); Xianbin Wang, Hangzhou (CN); Jun Wang, Hangzhou (CN); Wen Tong, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/467,782

(22) Filed: Sep. 15, 2023

(65) Prior Publication Data

US 2024/0007220 A1   Jan. 4, 2024

Related U.S. Application Data

(63) Continuation of application No. PCT/CN2022/077439, filed on Feb. 23, 2022.

(30) Foreign Application Priority Data

Mar. 16, 2021 (CN) .......................... 202110282307.5

(51) Int. Cl.
*H04L 1/00* (2006.01)
*H03M 13/13* (2006.01)

(52) U.S. Cl.
CPC .......... *H04L 1/0041* (2013.01); *H03M 13/13* (2013.01); *H04L 1/0045* (2013.01); *H04L 1/0057* (2013.01)

(58) Field of Classification Search
None
See application file for complete search history.

(56) References Cited

U.S. PATENT DOCUMENTS

| | | | |
|---|---|---|---|
| 11,057,154 B2 * | 7/2021 | Wang | H04L 1/0013 |
| 2016/0013810 A1 * | 1/2016 | Gross | H03M 13/617 |
| | | | 714/776 |

(Continued)

FOREIGN PATENT DOCUMENTS

| | | |
|---|---|---|
| CN | 113541698 A | 10/2021 |
| CN | 114915297 A | 8/2022 |

OTHER PUBLICATIONS

K. Chen, L. Wu, C. Xu, J. Li, H. Xu and J. Jiang, "ARUM: Polar-Coded HARQ Scheme Based on Incremental Channel Polarization," in IEEE Communications Letters, vol. 22, No. 12, pp. 2519-2522, Dec. 2018, (Year: 2018).*

(Continued)

*Primary Examiner* — Daniel F. McMahon
(74) *Attorney, Agent, or Firm* — HAUPTMAN HAM, LLP

(57) ABSTRACT

Embodiments of this application relate to the field of communications technologies, and provide an encoding and decoding method and apparatus, to reduce encoding/decoding complexity and improve encoding/decoding performance. In the method, a transmit device may obtain N to-be-encoded vectors. The transmit device may encode the N to-be-encoded vectors based on a polar code kernel matrix, to obtain N temporary code blocks. The transmit device may respectively perform a mask operation on target bit sequences in an $(n+1)^{th}$ temporary code block to an $(n+M)^{th}$ temporary code block and a source bit sequence segment of an $n^{th}$ temporary code block, to obtain M mask bit sequences. The transmit device may respectively encode the M mask bit sequences based on the polar kernel matrix, to obtain M encoded mask bit sequences. The transmit device may sum the M encoded mask bit sequences and M temporary code blocks, to obtain M first code blocks.

20 Claims, 8 Drawing Sheets

(56) References Cited

U.S. PATENT DOCUMENTS

| | | | | |
|---|---|---|---|---|
| 2017/0366199 A1* | 12/2017 | Ge | ............ | H03M 13/09 |
| 2018/0331693 A1* | 11/2018 | Lou | ............ | H03M 13/15 |
| 2018/0375612 A1* | 12/2018 | Sarkis | ............ | H04L 1/0058 |
| 2020/0099399 A1* | 3/2020 | Xie | ............ | H04W 72/23 |
| 2020/0136650 A1* | 4/2020 | Huang | ............ | H03M 13/13 |
| 2021/0013902 A1* | 1/2021 | Jang | ............ | H03M 13/13 |
| 2021/0273746 A1* | 9/2021 | Jeong | ............ | H03M 13/6362 |
| 2021/0328716 A1* | 10/2021 | Noh | ............ | H04L 1/0057 |
| 2021/0399742 A1* | 12/2021 | Xie | ............ | H03M 13/091 |

OTHER PUBLICATIONS

Wu Xiaowei et al: "Partially Information Coupled Polar Codes", IEEE Access, vol. 6, XP011697895, (Nov. 19, 2018), total 14 pages.
Extended European Search Report issued in corresponding European Application No. 22770274.3, dated Jul. 15, 2024, pp. 1-13.

\* cited by examiner

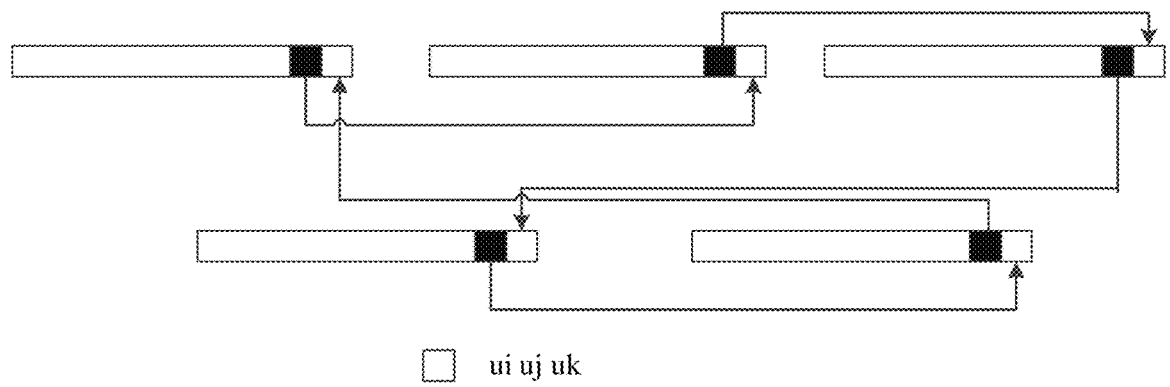
FIG. 8
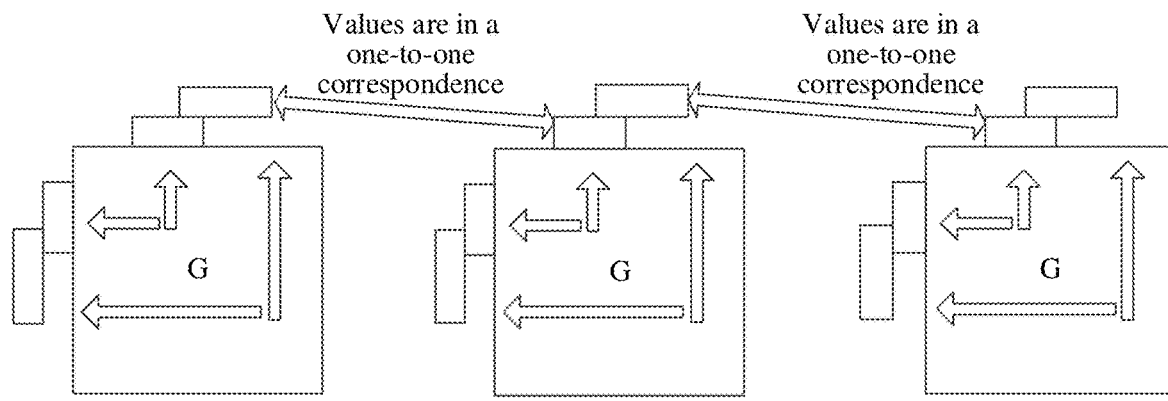
FIG. 9
FIG. 10

ENCODING AND DECODING METHOD AND APPARATUS

CROSS-REFERENCE TO RELATED APPLICATIONS

This application is a continuation of International Patent Application No. PCT/CN2022/077439, filed on Feb. 23, 2022, which claims priority to Chinese Patent Application No. 202110282307.5, filed on Mar. 16, 2021. The disclosures of the aforementioned applications are hereby incorporated by reference in their entireties.

TECHNICAL FIELD

This application relates to the field of communications technologies, and in particular, to an encoding and decoding method and apparatus.

BACKGROUND

Currently, polar encoding has been determined by the $3^{rd}$ generation partnership project (3GPP) as a control channel encoding solution in a 5G control channel enhanced mobile broadband (eMBB) scenario. Some mainstream polar code decoding methods may be classified into two types based on decoding orders: polar code sequential decoding and polar code non-sequential decoding. With successive cancellation list (SCL) decoding in the polar code sequential decoding, a polar code has good short code performance, but complexity of a long code is $N*\log(N)$. In addition, spatially coupled code ensembles are also codes proved to be capable of reaching a channel capacity. Tanner graphs of code blocks are connected, to achieve an effect of increasing an encoding gain. Although computational complexity of the spatially coupled code ensembles is N, short code performance is poor.

SUMMARY

Embodiments of this application provide an encoding and decoding method and apparatus, to reduce encoding/decoding complexity and improve encoding/decoding performance.

According to a at least one aspect, an encoding method is provided. The method may be performed by a transmit device. The transmit device may be a terminal device or a network device. In the method, the transmit device may obtain N to-be-encoded vectors. The transmit device may encode the N to-be-encoded vectors based on a polar code kernel matrix, to obtain N temporary code blocks. The transmit device may respectively perform a mask operation on target bit sequences in an $(n+1)^{th}$ temporary code block to an $(n+M)^{th}$ temporary code block and a source bit sequence segment of an $n^{th}$ temporary code block, to obtain M mask bit sequences. M is greater than or equal to 1 and is less than or equal to N−1. Herein, the target bit sequences may be sub-sequences of the $(n+1)^{th}$ temporary code block to the $(n+M)^{th}$ temporary code block, a source bit sequence may be a sub-sequence of the $n^{th}$ temporary code block, and the source bit sequence segment may be a sub-sequence of the source bit sequence. The source bit sequence segment may be one of M source bit sequence segments. n is greater than or equal to 1 and is less than or equal to N−M, N is greater than or equal to 2, and n=1, 2, 3, . . . , N−M. The transmit device may respectively encode the M mask bit sequences based on the polar kernel matrix, to obtain M encoded mask bit sequences. The transmit device may sum the M encoded mask bit sequences and M temporary code blocks, to obtain M first code blocks. An $M^{th}$ first code block may be obtained by summing an $M^{th}$ encoded mask bit sequence and the $(n+M)^{th}$ temporary code block. The M temporary code blocks may include the $(n+1)^{th}$ temporary code block to the $(n+M)^{th}$ temporary code block. The transmit device may send a codeword. The codeword includes N code blocks, the N code blocks may include the M first code blocks and N−M second code blocks, and the second code blocks may be code blocks in the N temporary code blocks other than the M temporary code blocks.

Based on the foregoing solution, the transmit device may implement a coupling relationship between a source bit sequence segment and a target bit sequence, so that a code length becomes longer, an encoding/decoding gain can be obtained, and encoding performance can be improved. In addition, because the code length is less than a length of a long code, complexity can be reduced.

In a possible implementation, values of a target bit sequence of the $(n+M)^{th}$ code block in the N code blocks may be in a one-to-one correspondence with values of a source bit sequence segment in the $n^{th}$ code block, the $(n+M)^{th}$ code block is one of the first code blocks, and the $n^{th}$ code block is one of the second code blocks.

Based on the foregoing solution, the transmit device may implement a coupling relationship between a source bit sequence segment and a target bit sequence, so that a code length becomes longer, an encoding/decoding gain can be obtained, and encoding performance can be improved.

In a possible implementation, values of a target bit sequence of a $1^{st}$ code block in the N code blocks may be in a one-to-one correspondence with values of an $M^{th}$ source bit sequence segment of M source bit sequences in a last code block in the N code blocks.

Based on the foregoing solution, the target bit sequence of the $1^{st}$ code block and the source bit sequence segment of the last code block may be coupled, so that a larger encoding/decoding gain can be obtained, and the encoding/decoding performance can be further improved.

In a possible implementation, the one-to-one correspondence may be one of the following: sequentially the same, the same after sequential reversal, or the same after interleaving.

Based on the foregoing solution, the transmit device may perform an operation such as sequential reversal or interleaving on the target bit sequence and the source bit sequence segment, so that a larger encoding/decoding gain can be obtained.

In a possible implementation, the target bit sequence may include at least one non-zero element. Based on the foregoing solution, the target bit sequence may include at least one non-zero element, so that values of the target bit sequence are in a one-to-one correspondence with values of the source bit sequence segment.

In at least one implementation, the transmit device may determine a plurality of to-be-deleted rows and columns in the polar kernel matrix. A $1^{st}$ to-be-deleted column is a last column of the polar kernel matrix, a $1^{st}$ to-be-deleted row is a row with a value 1 in the last column of the polar kernel matrix, a $t^{th}$ to-be-deleted column is a column whose column weight is 1, and a $t^{th}$ to-be-deleted row is a row with a value 1 in the column whose column weight is 1. The transmit device may determine to-be-deleted rows that are in an $n^{th}$ to-be-encoded vector and that correspond to the plurality of to-be-deleted rows and columns. The transmit device may determine a position of a target bit sequence and a position of a source bit sequence from the determined to-be-deleted rows in the $n^{th}$ to-be-encoded vector. t is greater than or equal to 1.

Based on the foregoing solution, the transmit device may determine positions of a source bit sequence and a target bit sequence in a to-be-encoded vector, so that the selected positions of the source bit sequence and the target bit sequence have little impact on another bit in the to-be-encoded vector. Therefore, changing values of the target bit sequence also has little impact on the to-be-encoded vector.

In at least one implementation, the transmit device may sort the to-be-deleted rows in the $n^{th}$ to-be-encoded vector based on a deletion order of the to-be-deleted rows in the $n^{th}$ to-be-encoded vector, and the transmit device selects C consecutive positions from front to back as the position of the target bit sequence. Alternatively, the transmit device may sort the to-be-deleted rows in the $n^{th}$ to-be-encoded vector in descending order of row values, and the transmit device may select C consecutive positions from front to back as the target bit sequence. Alternatively, the transmit device may sort the to-be-deleted rows in the $n^{th}$ to-be-encoded vector in descending order based on reliability of corresponding subchannels, and the transmit device selects $(C+1)^{th}$ to $(2C)^{th}$ consecutive positions from front to back as the source bit sequence. Alternatively, the transmit device may sort the to-be-deleted rows in the $n^{th}$ to-be-encoded vector based on a deletion order of the to-be-deleted rows in the $n^{th}$ to-be-encoded vector, and the transmit device selects $(C+1)^{th}$ to $(2C)^{th}$ consecutive positions from front to back as the source bit sequence. Alternatively, the transmit device may sort the to-be-deleted rows in the $n^{th}$ to-be-encoded vector in descending order of row values, and the transmit device may select $(C+1)^{th}$ to $(2C)^{th}$ consecutive positions from front to back as the source bit sequence. Alternatively, the transmit device may sort the to-be-deleted rows in the $n^{th}$ to-be-encoded vector in descending order based on reliability of corresponding subchannels, and the transmit device may select $(C+1)^{th}$ to $(2C)^{th}$ consecutive positions from front to back as the source bit sequence. C is greater than or equal to 1.

Based on the foregoing solution, the transmit device may determine positions of C-long source bit sequences and a C-long target bit sequences in a to-be-encoded vector, so that the selected positions of the source bit sequence and the target bit sequence have little impact on another bit in the to-be-encoded vector.

In at least one implementation, the target bit sequence and the source bit sequence may not include a punctured bit or a shortened bit. Based on the foregoing solution, the target bit sequence and the source bit sequence do not include a punctured bit or a shortened bit, so that a coupling manner between the target bit sequence and the source bit sequence can be relatively flexible, an encoding gain can be obtained, and encoding performance can be improved.

In at least one implementation, the transmit device may send the N code blocks. The target bit sequences may not be sent. Based on the foregoing solution, the transmit device does not send the target bit sequences when sending the N code blocks, so that an amount of sent information can be reduced.

According to at least one aspect, a decoding method is provided. The method may be performed by a receive device. The receive device may be a terminal device or a network device. In the method, the receive device may receive a codeword. The codeword may include N code blocks, and the N code blocks may include M first code blocks and N−M second code blocks. N is greater than or equal to 2, and M is greater than or equal to 1 and is less than or equal to N−1. The receive device may decode the N code blocks based on a polar code kernel matrix. Target bit sequences in $(n+1)^{th}$ to $(n+M)^{th}$ decoded code blocks may be obtained based on M source bit sequence segments included in an $n^{th}$ decoded code block. A source bit sequence may be a sub-sequence of the $n^{th}$ decoded code block, the source bit sequence segments may be sub-sequences of the source bit sequence, and the target bit sequences may be sub-sequences of the $(n+1)^{th}$ to $(n+M)^{th}$ decoded code blocks. The $n^{th}$ decoded code block may be obtained by decoding the first code blocks, and the $(n+1)^{th}$ to $(n+M)^{th}$ decoded code blocks may be obtained by decoding the second code blocks. n is greater than or equal to 1 and is less than or equal to N−M, and n=1, 2, 3, . . . , N−M.

In at least one implementation, values of a target bit sequence of the $(n+M)^{th}$ decoded code block may be in a one-to-one correspondence with values of an $M^{th}$ source bit sequence segment in the M source bit sequence segments.

In at least one implementation, values of a target bit sequence of a $1^{st}$ decoded code block may be in a one-to-one correspondence with values of an $M^{th}$ source bit sequence segment of M source bit sequences in a last decoded code block.

In at least one implementation, the one-to-one correspondence may be one of the following: sequentially the same, the same after sequential reversal, or the same after interleaving.

In at least one implementation, a quantity of bits in the target bit sequence may be the same as a quantity of bits in the source bit sequence segment.

In at least one implementation, the target bit sequence may include at least one non-zero element.

In at least one implementation, the receive device may determine a plurality of to-be-deleted rows and columns in the polar kernel matrix. A $1^{st}$ to-be-deleted column is a last column of the polar kernel matrix, a $1^{st}$ to-be-deleted row is a row with a value 1 in the last column of the polar kernel matrix, a $t^{th}$ to-be-deleted column is a column whose column weight is 1, a $t^{th}$ to-be-deleted row is a row with a value 1 in the column whose column weight is 1, and t is greater than or equal to 1. The receive device may determine to-be-deleted rows that are in the decoded $n^{th}$ code block and $(n+1)^{th}$ code block to $(n+M)^{th}$ code block and that correspond to the plurality of to-be-deleted rows and columns. The receive device may determine a position of a source bit sequence from the determined to-be-deleted rows of the $n^{th}$ decoded code block, and determine a position of a target bit sequence from the determined to-be-deleted rows of the decoded $n^{th}$ code block and $(n+1)^{th}$ code block.

In at least one implementation, the receive device may sort the to-be-deleted rows in the $n^{th}$ decoded code block based on a deletion order, and the receive device may select C consecutive positions from front to back as the position of the target bit sequence. Alternatively, the receive device sorts the to-be-deleted rows in descending order of row values, and the receive device may select C consecutive positions from front to back as the target bit sequence. Alternatively, the receive device may sort the to-be-deleted rows in descending order based on reliability of corresponding subchannels, and the receive device may select $(C+1)^{th}$ to $(2C)^{th}$ consecutive positions from front to back as the source bit sequence. Alternatively, the receive device may sort the to-be-deleted rows in the $n^{th}$ decoded code block based on a deletion order, and the receive device may select $(C+1)^{th}$ to $(2C)^{th}$ consecutive positions from front to back as the source bit sequence. Alternatively, the receive device sorts the to-be-deleted rows in descending order of row values, and the receive device may select $(C+1)^{th}$ to $(2C)^{th}$ consecutive positions from front to back as the source bit sequence. Alternatively, the receive device may sort the to-be-deleted rows in descending order based on reliability of corresponding subchannels, and the receive device may select $(C+1)^{th}$ to $(2C)^{th}$ consecutive positions from front to back as the source bit sequence. C is greater than or equal to 1.

According to at least one aspect, a communications apparatus is provided. The apparatus may include modules/units configured to perform the method in any one of the first aspect or the possible implementations of the first aspect, or may further include modules/units configured to perform the method in any one of the second aspect or the possible implementations of the second aspect, for example, a processing unit and an input/output unit.

For example, when the apparatus includes the modules/units configured to perform the method in any one of the first aspect or the possible implementations of the first aspect, the processing unit is configured to obtain N to-be-encoded vectors. The processing unit is further configured to encode the N to-be-encoded vectors based on a polar code kernel matrix, to obtain N temporary code blocks. The processing unit is further configured to respectively perform a mask operation on target bit sequences in an $(n+1)^{th}$ temporary code block to an $(n+M)^{th}$ temporary code block and a source bit sequence segment of an $n^{th}$ temporary code block, to obtain M mask bit sequences. M is greater than or equal to 1 and is less than or equal to N−1, the target bit sequences are sub-sequences of the $(n+1)^{th}$ temporary code block to the $(n+M)^{th}$ temporary code block, a source bit sequence is a sub-sequence of the $n^{th}$ temporary code block, the source bit sequence segment is a sub-sequence of the source bit sequence, the source bit sequence segment is one of M source bit sequence segments, n is greater than or equal to 1 and is less than or equal to N−M, N is greater than or equal to 2, and n=1, 2, 3, ..., N−M. The processing unit is further configured to respectively encode the M mask bit sequences based on the polar kernel matrix, to obtain M encoded mask bit sequences. The processing unit is further configured to sum the M encoded mask bit sequences and M temporary code blocks, to obtain M first code blocks. An $M^{th}$ first code block is obtained by summing an $M^{th}$ encoded mask bit sequence and the $(n+M)^{th}$ temporary code block, and the M temporary code blocks include the $(n+1)^{th}$ temporary code block to the $(n+M)^{th}$ temporary code block. The input/output unit is further configured to send a codeword. The codeword includes N code blocks, the N code blocks include the M first code blocks and N−M second code blocks, and the second code blocks are code blocks in the N temporary code blocks other than the M temporary code blocks.

In a design, values of a target bit sequence of the $(n+M)^{th}$ code block in the N code blocks are in a one-to-one correspondence with values of a source bit sequence segment in the $n^{th}$ code block, the $(n+M)^{th}$ code block is one of the first code blocks, and the $n^{th}$ code block is one of the second code blocks.

In a design, values of a target bit sequence of a $1^{st}$ code block in the N code blocks are in a one-to-one correspondence with values of an $M^{th}$ source bit sequence segment of M source bit sequences in a last code block in the N code blocks.

In a design, the one-to-one correspondence is one of the following: sequentially the same, the same after sequential reversal, or the same after interleaving.

In a design, a quantity of bits in the target bit sequence is the same as a quantity of bits in the source bit sequence segment.

In a design, the target bit sequence includes at least one non-zero element.

In a design, the processing unit is further configured to: determine a plurality of to-be-deleted rows and columns in the polar kernel matrix, where a $1^{st}$ to-be-deleted column is a last column of the polar kernel matrix, a $1^{st}$ to-be-deleted row is a row with a value 1 in the last column of the polar kernel matrix, a $t^{th}$ to-be-deleted column is a column whose column weight is 1, and a $t^{th}$ to-be-deleted row is a row with a value 1 in the column whose column weight is 1; determine to-be-deleted rows that are in an $n^{th}$ to-be-encoded vector and that correspond to the plurality of to-be-deleted rows and columns; and determine a position of a target bit sequence and a position of a source bit sequence from the determined to-be-deleted rows in the $n^{th}$ to-be-encoded vector. t is greater than or equal to 1.

In a design, when determining the position of the target bit sequence and the position of the source bit sequence from the determined to-be-deleted rows in the $n^{th}$ to-be-encoded vector, the processing unit is specifically configured to: sort the to-be-deleted rows in the $n^{th}$ to-be-encoded vector based on a deletion order of the to-be-deleted rows in the $n^{th}$ to-be-encoded vector, and select C consecutive positions from front to back as the position of the target bit sequence; or sort the to-be-deleted rows in the $n^{th}$ to-be-encoded vector in descending order of row values, and select C consecutive positions from front to back as the target bit sequence; or sort the to-be-deleted rows in the $n^{th}$ to-be-encoded vector in descending order based on reliability of corresponding subchannels, and select $(C+1)^{th}$ to $(2C)^{th}$ consecutive positions from front to back as the source bit sequence; or sort the to-be-deleted rows in the $n^{th}$ to-be-encoded vector based on a deletion order of the to-be-deleted rows in the $n^{th}$ to-be-encoded vector, and select $(C+1)^{th}$ to $(2C)^{th}$ consecutive positions from front to back as the source bit sequence; or sort the to-be-deleted rows in the $n^{th}$ to-be-encoded vector in descending order of row values, and select $(C+1)^{th}$ to $(2C)^{th}$ consecutive positions from front to back as the source bit sequence; or sort the to-be-deleted rows in the $n^{th}$ to-be-encoded vector in descending order based on reliability of corresponding subchannels, and select $(C+1)^{th}$ to $(2C)^{th}$ consecutive positions from front to back as the source bit sequence. C is greater than or equal to 1.

In a design, when sending the codeword, the input/output unit is specifically configured to: send a bit sequence other than the target bit sequence in the N code blocks.

For example, when the apparatus includes the modules/units configured to perform the method in any one of the second aspect or the possible implementations of the second aspect, the input/output unit is configured to receive a codeword. The codeword includes N code blocks, the N code blocks include M first code blocks and N−M second code blocks, N is greater than or equal to 2, and M is greater than or equal to 1 and is less than or equal to N−1. The processing unit is configured to decode the N code blocks based on a polar code kernel matrix. Target bit sequences in $(n+1)^{th}$ to $(n+M)^{th}$ decoded code blocks are obtained based on M source bit sequence segments included in an $n^{th}$ decoded code block, a source bit sequence is a sub-sequence of the $n^{th}$ decoded code block, the source bit sequence segments are sub-sequences of the source bit sequence, the target bit sequences are sub-sequences of the $(n+1)^{th}$ to $(n+M)^{th}$ decoded code blocks, the $n^{th}$ decoded code block is obtained by decoding the first code blocks, the $(n+1)^{th}$ to $(n+M)^{th}$ decoded code blocks are obtained by decoding the second code blocks, n is greater than or equal to 1 and is less than or equal to N−M, and n=1, 2, 3, . . . , N−M.

In a design, values of a target bit sequence of the $(n+M)^{th}$ decoded code block are in a one-to-one correspondence with values of an $M^{th}$ source bit sequence segment in the M source bit sequence segments.

In a design, values of a target bit sequence of a $1^{st}$ decoded code block are in a one-to-one correspondence with values of an $M^{th}$ source bit sequence segment of M source bit sequences in a last decoded code block.

In a design, the one-to-one correspondence is one of the following: sequentially the same, the same after sequential reversal, or the same after interleaving.

In a design, a quantity of bits in the target bit sequence is the same as a quantity of bits in the source bit sequence segment.

In a design, the target bit sequence includes at least one non-zero element.

In a design, the processing unit is further configured to: determine a plurality of to-be-deleted rows and columns in the polar kernel matrix, where a $1^{st}$ to-be-deleted column is a last column of the polar kernel matrix, a $1^{st}$ to-be-deleted row is a row with a value 1 in the last column of the polar kernel matrix, a $t^{th}$ to-be-deleted column is a column whose column weight is 1, a $t^{th}$ to-be-deleted row is a row with a value 1 in the column whose column weight is 1, and t is greater than or equal to 1; determine to-be-deleted rows that are in the decoded $n^{th}$ code block and $(n+1)^{th}$ code block to $(n+M)^{th}$ code block and that correspond to the plurality of to-be-deleted rows and columns; and determine a position of a source bit sequence from the determined to-be-deleted rows of the $n^{th}$ decoded code block, and determine a position of a target bit sequence from the determined to-be-deleted rows of the decoded $n^{th}$ code block and $(n+1)^{th}$ code block.

In a design, when determining the position of the source bit sequence from the determined to-be-deleted rows of the $n^{th}$ decoded code block, and determining the position of the target bit sequence from the determined to-be-deleted rows of the decoded $n^{th}$ code block and $(n+1)^{th}$ code block, the processing unit is specifically configured to: sort the to-be-deleted rows in the $n^{th}$ decoded code block based on a deletion order, and select C consecutive positions from front to back as the position of the target bit sequence; or sort the to-be-deleted rows in descending order of row values, and select C consecutive positions from front to back as the target bit sequence; or sort the to-be-deleted rows in descending order based on reliability of corresponding subchannels, and select $(C+1)^{th}$ to $(2C)^{th}$ consecutive positions from front to back as the source bit sequence; or sort the to-be-deleted rows in the $n^{th}$ decoded code block based on a deletion order, and select $(C+1)^{th}$ to $(2C)^{th}$ consecutive positions from front to back as the source bit sequence; or sort the to-be-deleted rows in descending order of row values, and select $(C+1)^{th}$ to $(2C)^{th}$ consecutive positions from front to back as the source bit sequence; or sort the to-be-deleted rows in descending order based on reliability of corresponding subchannels, and select $(C+1)^{th}$ to $(2C)^{th}$ consecutive positions from front to back as the source bit sequence. C is greater than or equal to 1.

According to at least one aspect, a communications apparatus is provided. The communications apparatus includes a processor and a transceiver. The transceiver performs receiving and sending steps of the method in any one of the first aspect or the possible implementations of the first aspect, or performs receiving and sending steps of the method in any one of the second aspect or the possible implementations of the second aspect. When a controller runs, the processor performs, by using a hardware resource in the controller, a processing step other than the receiving and sending steps in the method in any one of the first aspect or the possible implementations of the first aspect, or performs a processing step other than the receiving and sending steps in the method in any one of the second aspect or the possible implementations of the second aspect.

In at least one implementation, the communications apparatus further includes a memory. The memory may be located inside the apparatus, or may be located outside the apparatus, and connected to the apparatus.

In at least one implementation, the memory may be integrated with the processor.

According to at least one aspect, a chip is provided. The chip includes a logic circuit and a communications interface.

In a design, the logic circuit is configured to: obtain N to-be-encoded vectors, and encode the N to-be-encoded vectors based on a polar code kernel matrix, to obtain N temporary code blocks. The logic circuit is further configured to: respectively perform a mask operation on target bit sequences in an $(n+1)^{th}$ temporary code block to an $(n+M)^{th}$ temporary code block and a source bit sequence segment of an $n^{th}$ temporary code block, to obtain M mask bit sequences; and respectively encode the M mask bit sequences based on the polar kernel matrix, to obtain M encoded mask bit sequences. The logic circuit is further configured to sum the M encoded mask bit sequences and M temporary code blocks, to obtain M first code blocks. The communications interface is configured to output a codeword.

In a design, the communications interface is configured to input a codeword. The codeword includes N code blocks, the N code blocks include M first code blocks and N−M second code blocks, N is greater than or equal to 2, and M is greater than or equal to 1 and is less than or equal to N−1. The logic circuit is configured to decode the N code blocks based on a polar code kernel matrix.

According to at least one aspect, this application provides a computer-readable storage medium. The computer-readable storage medium stores instructions, and when the instructions are run on a computer, the computer is enabled to perform the method according to the foregoing aspect.

According to at least one aspect, this application provides a computer program product storing instructions. When the instructions are run on a computer, the computer is enabled to perform the method according to the foregoing aspect.

According to at least one aspect, this application provides a communications system, including at least one terminal device described above and at least one network device described above.

In addition, for beneficial effects of the second aspect to the eighth aspect, refer to the beneficial effects described in the first aspect.

BRIEF DESCRIPTION OF DRAWINGS

FIG. 8 is a schematic diagram of a code block sending manner according to at least one embodiment of this application;

FIG. 9 is a schematic diagram of shortening a polar kernel matrix according to at least one embodiment of this application;

FIG. 10 is a schematic diagram of an inter-code-block bit sequence coupling manner according to at least one embodiment of this application;

DESCRIPTION OF EMBODIMENTS

In the field of communications technologies, a communications device (for example, a terminal device or a base station) may perform channel encoding in a polar code manner. The following describes polar encoding in two manners.

Manner 1: To-be-encoded bits are encoded by using a generator matrix.

$x_1^N = u_1^N G_N$. $u_1^N$ is a row vector, $u_1^N = (u_1, u_2, \ldots, u_N)$, N is a code length, and N is an integer greater than or equal to 1. $u_i$ is a bit before encoding, and i is an integer between 1 and N. $u_1^N$ includes an information bit and/or a frozen bit, that is, $u_i$ may be an information bit or a frozen bit. The information bit is a bit used to carry information. The frozen bit is a padding bit, and the frozen bit may be usually 0.

$G_N$ is a generator matrix, $G_N$ is an N*N matrix, and $G_N = B_N F_2^{\otimes (\log_2(N))}$ or $G_N = F_2^{\otimes (\log_2(N))}$. $B_N$ is an N*N transposed matrix. For example, $B_N$ may be a bit reversal (bit reversal) matrix.

$$F_2 = \begin{bmatrix} 1 & 0 \\ 1 & 1 \end{bmatrix},$$

and $F_2^{\otimes (\log_2(N))}$ is a Kronecker product of $\log_2(N)$ matrices $F_2$. Both addition and multiplication above are operations in a binary Galois field. $G_N$ may also be referred to as a generator matrix kernel.

Manner 2: A polar encoding process is described by using a schematic encoding diagram.

Figure 1:
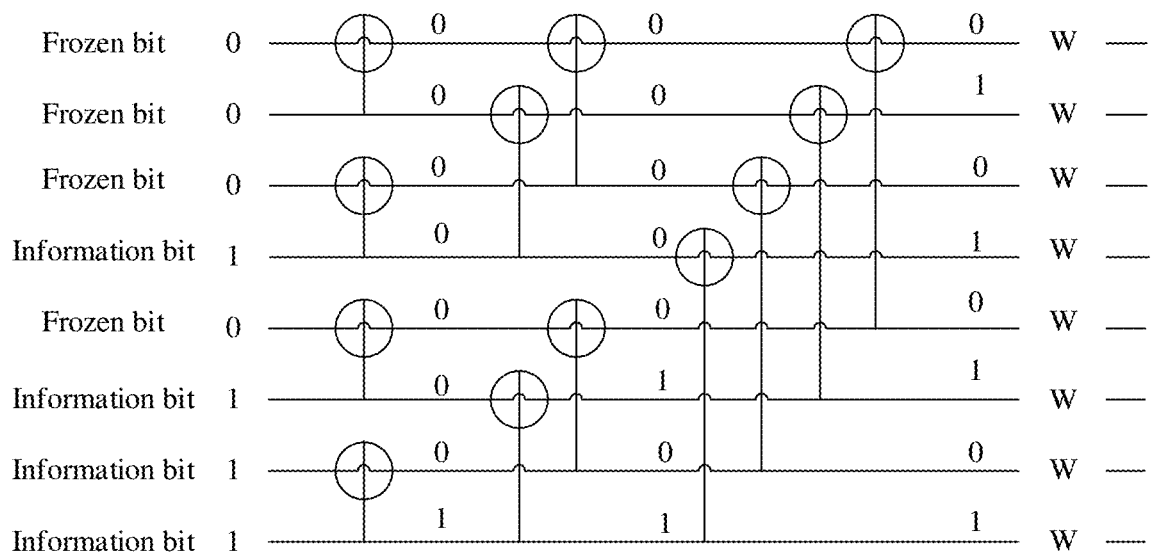
FIG. 1 is a schematic diagram of polar code encoding according to at least one embodiment of this application.

Refer to FIG. 1. A code length of encoding corresponding to the encoding diagram is 8. Each circle in each row represents summing a bit of a row in which the circle is located and a row reached by the circle, and a bit on a right side of the circle is a summation result. For example, a $1^{st}$ circle in a row in which a $1^{st}$ frozen bit is located refers to summing the frozen bit 0 in the row in which the circle is located, that is, a $1^{st}$ row, and a bit 0 in a row reached by the circle, that is, a $2^{nd}$ row, and a summation result is 0.

Currently, polar encoding has been determined by the $3^{rd}$ generation partnership project (3GPP) as a control channel encoding solution in a 5G control channel enhanced mobile broadband (eMBB) scenario. Current mainstream polar code decoding methods may be classified into two types based on their decoding orders: polar code sequential decoding and polar code non-sequential decoding. With successive cancellation list (SCL) decoding in the polar code sequential decoding, a polar code has good short code performance, but complexity of a long code is N*log(N). In addition, spatially coupled code ensembles are also codes proved to be capable of reaching a channel capacity. Tanner graphs of code blocks are connected, to achieve an effect of increasing an encoding gain. Although computational complexity of the spatially coupled code ensembles is N, short code performance is poor.

Embodiments of this application provide an encoding and decoding method, which can reduce encoding/decoding complexity and improve encoding/decoding performance. In the method, some bits of different code blocks may be coupled, to obtain an encoding/decoding gain and improve encoding/decoding performance, and complexity is lower than complexity of a long code.

Embodiments of this application may be applied to a plurality of fields in which polar encoding is used, for example, the data storage field, the optical network communications field, and the wireless communications field. The wireless communications field may include but is not limited to a 5G communications system, a future communications system (such as a 6G communications system), a satellite communications system, a narrowband-internet of things (NB-IoT) system, a global system for mobile communications (GSM), an enhanced data rate for GSM evolution (EDGE) system, a wideband code division multiple access (WCDMA) system, a code division multiple access 2000 (CDMA2000) system, a time division-synchronous code division multiple access (TD-SCDMA) system, a long term evolution (LTE) system, and three major application scenarios of a 5G mobile communications system: eMBB, ultra-reliable and low latency communications (URLLC), and mass machine-type communications (mMTC).

Figure 2:
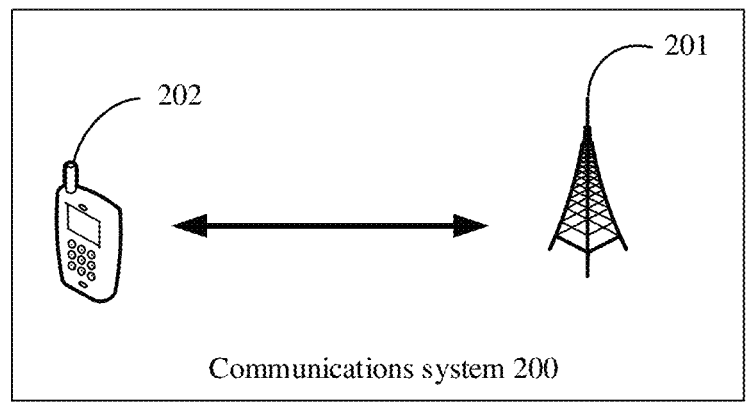
FIG. 2 is a schematic diagram of a communications system applicable to an encoding and decoding method according to at least one embodiment of this application.

With reference to FIG. 2, the following describes a communications system to which the encoding and decoding method provided in embodiments of this application is applicable. Refer to FIG. 2. A communications system 200 includes a transmit device 201 and a receive device 202. The transmit device 201 may be a network device or a terminal device, and the receive device 202 may be a network device or a terminal device. Optionally, when the transmit device 201 is a network device, the receive device 202 may be a terminal device. When the receive device 202 is a network device, the transmit device 201 may be a terminal device.

The transmit device 201 may include an encoder. The transmit device 201 may perform polar encoding on to-be-encoded bits by using the encoder, and output an encoded codeword. The encoded codeword may be transmitted on a channel to the receive device 202 after rate matching, interleaving, and modulation. The receive device 202 may include a decoder. The receive device 202 may receive and demodulate a signal from the transmit device 201. The receive device 202 may decode the received signal by using the decoder.

The terminal device in this application includes a device that provides voice and/or data connectivity for a user, which specifically includes a device that provides voice for a user, or a device that provides data connectivity for a user, or a device that provides voice and data connectivity for a user, for example, may include a handheld device with a wireless connection function, or a processing device connected to a wireless modem. The terminal device may include user equipment (UE), a wireless terminal device, a mobile terminal device, a device-to-device (D2D) terminal device, a vehicle to everything (V2X) terminal device, a machine-to-machine/machine type communications (M2M/MTC) terminal device, an internet of things (IoT) terminal device, a subscriber unit, a subscriber station, a mobile station, a remote station, an access point (AP), a remote terminal, an access terminal, a user terminal, a user agent, a user device, a satellite, an unmanned aerial vehicle, a balloon, an airplane, or the like. For example, the terminal device may include a mobile phone (or referred to as a "cellular" phone), a computer with a mobile terminal device, or a portable, pocket-sized, handheld, or computer built-in mobile apparatus, for example, a device such as a personal communications service (PCS) phone, a cordless telephone set, a session initiation protocol (SIP) phone, a wireless local loop (WLL) station, or a personal digital assistant (PDA); and may further include a limited device, for example, a device with relatively low power consumption, a device with a limited storage capability, or a device with a limited computing capability, for example, include an information sensing device such as a barcode, a radio frequency identification (RFID), a sensor, a global positioning system (GPS), or a laser scanner. For example, but not for limitation, in embodiments of this application, the terminal device may alternatively be a wearable device. The wearable device may also be referred to as a wearable intelligent device, an intelligent wearable device, or the like, and is a general term for wearable devices developed by intelligently designing everyday wearing by applying a wearable technology. The terminal device described above may be considered as an in-vehicle terminal device if located in a vehicle (for example, placed in a vehicle or mounted in a vehicle). The in-vehicle terminal device is also referred to as, for example, an on-board unit (OBU).

The network device in this application includes, for example, an access network (AN) device, such as a base station (for example, an access point), and may be a device that is in an access network and that communicates with a wireless terminal device over an air interface through one or more cells. Alternatively, the network device is, for example, a road side unit (RSU) in a vehicle-to-everything (V2X) technology. The network device may include an evolved NodeB (NodeB or eNB or e-NodeB) in a long term evolution (LTE) or long term evolution-advanced (LTE-A) system, or may include a next generation NodeB (gNB) in an evolved packet core (EPC), a $5^{th}$ generation mobile communications technology (5G), a new radio (NR) system, or may include a central unit (CU) and a distributed unit (DU) in a cloud radio access network (Cloud RAN) system, a satellite, an unmanned aerial vehicle, a balloon, an aircraft, or the like. This is not limited in embodiments of this application.

Figure 3A:
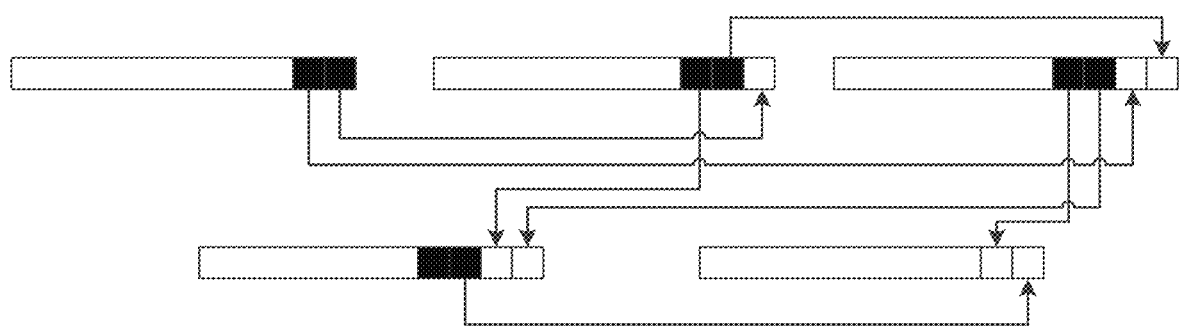
FIG. 3A is a schematic diagram of an inter-code-block coupling manner according to at least one embodiment of this application.

With reference to FIG. 3A, a coupling relationship between some bits of different code blocks in embodiments of this application is described. As shown in FIG. 3A, the transmit device may encode N code blocks. An $n^{th}$ code block may include M source bit sequence segments. N may be greater than or equal to 2, M may be greater than or equal to 1, and may be less than or equal to N−1, and n may be greater than or equal to 1 and less than or equal to N. $(n+1)^{th}$ to $(n+M)^{th}$ code blocks may each include a target bit sequence, and the target bit sequence may be determined based on a source bit sequence segment. In FIG. 3A, an example in which M is equal to 2 is used for description. A $1^{st}$ code block to an $(n-1)^{th}$ code block each include two source bit sequence segments, and the $2^{nd}$ code block to the $n^{th}$ code block each include one or more target bit sequences. The $2^{nd}$ code block includes one target bit sequence, and the target bit sequence is determined based on one source bit sequence segment of the $1^{st}$ code block. The $3^{rd}$ code block includes two target bit sequences. One target bit sequence is determined based on one source bit sequence segment of the $1^{st}$ code block, and the other target bit sequence is determined based on one source bit sequence segment of the $2^{nd}$ code block. The $4^{th}$ code block includes two target bit sequences. One target bit sequence is determined based on one source bit sequence segment of the $2^{nd}$ code block, and the other target bit sequence is determined based on one source bit sequence segment of the $3^{rd}$ code block. By analogy, a last code block includes two target bit sequences. One target bit sequence is determined based on one source bit sequence segment in a last but two code block, and the other target bit sequence is determined based on one source bit sequence segment in a last but one code block. Optionally, the other source bit sequence segment in the last but one code block may be set to zero. FIG. 3A merely shows an example of a correspondence between a source bit sequence segment and a target bit sequence, and is not used as a limitation on the correspondence between a source bit sequence segment and a target bit sequence.

Figure 3B:
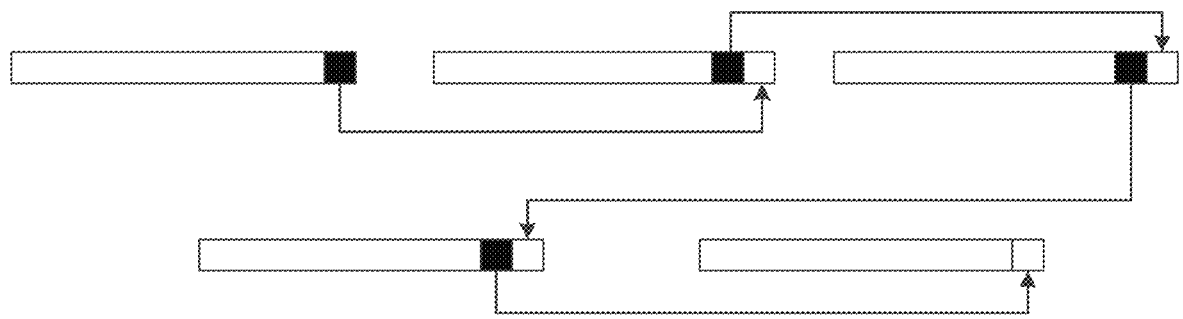
FIG. 3B is a schematic diagram of an inter-code-block coupling manner according to at least one embodiment of this application.

Refer to FIG. 3B. An example in which M is equal to 1 is used for description. A target bit sequence of an $(n+1)^{th}$ code block may be determined based on a source bit sequence of an $n^{th}$ code block. A target bit sequence of an $(n+2)^{th}$ code block may be determined based on a source bit sequence of the $(n+1)^{th}$ code block. By analogy, a target bit sequence of a last code block may be determined based on a source bit sequence of a last but one code block.

Figure 4:
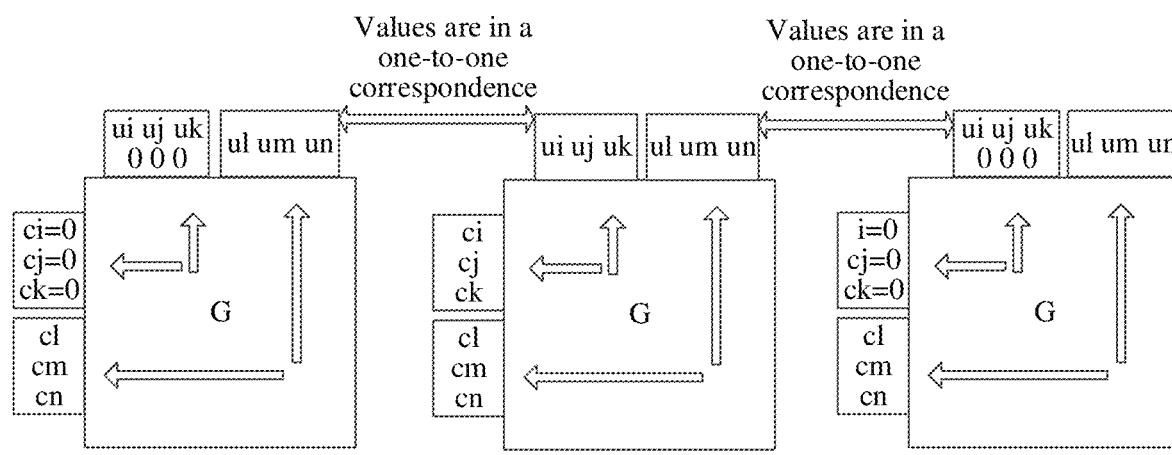
FIG. 4 is a schematic diagram of an inter-code-block bit sequence coupling manner according to at least one embodiment of this application.

In embodiments of this application, values of the target bit sequence may be in a one-to-one correspondence with values of the source bit sequence segment, or values of the target bit sequence may be in a one-to-one correspondence with values of the source bit sequence. The following uses FIG. 4 for description. Refer to FIG. 4. An example in which M is equal to 1 is used for description. ci, cj, and ck of each code block are a target bit sequence before encoding, and cl, cm, and cn are a source bit sequence before encoding. ui, uj, and uk of each code block are an encoded target bit sequence, and ul, um, and un are an encoded source bit sequence. ci, cj, and ck of a $1^{st}$ code block may be set to zero, and values of cl, cm, and cn of the $1^{st}$ code block may be in a one-to-one correspondence with values of ci, cj, and ck of a $2^{nd}$ code block. The rest may be deduced by analogy until a last code block, and cl, cm, and cn of the last code block may be set to zero. ui, uj, and uk of each code block may be set, so that values of encoded ci, cj, and ck are in a one-to-one correspondence with values of cl, cm, and cn of a previous code block.

One of ordinary skill in the art would understand that, in the foregoing ci, c may represent a name, and i may represent an index. That is, ci, cj, and ck have a same name, for example, the target bit sequence, and are an it h bit, a $j^{th}$ bit, and a $k^{th}$ bit, respectively. Similarly, representations of cj, ck, ui, uj, uk, cl, cm, cn, ul, um, and uk are the same as the representation of ci.

The following describes a manner of setting values of ui, uj, and uk of each code block. The transmit device may encode a to-be-encoded vector $u_1^N$ of a current code block based on a polar kernel matrix, to obtain a temporary code block $\widetilde{c_1^N} = u_1^N G_N$. The transmit device may perform a mask operation on the current code block, to determine a mask bit sequence of a target bit sequence of the current code block. The mask bit sequence is $m_C = (\widetilde{c_C} + \vec{c_C})$. $\widetilde{c_C}$ may refer to a C-long vector including a target bit sequence in the temporary code block $\widetilde{c_1^N}$. $\vec{c_C}$ may be a C-long vector including a source bit sequence segment in a previous temporary code block. C is greater than or equal to 1, and $G_N$ may be a polar kernel. Optionally, $\vec{c_C}$ of a $1^{st}$ code block is 0. The transmit device may perform polar encoding on the mask bit sequence. An encoded mask bit sequence is $m_1^N = (m_{C,0} G_N)$ $_{C,0} G_N$. $m_{C,0}$ is an N-long vector, the target bit sequence of the C-long vector is $m_C$, and values at all other positions of $m_{C,0}$ are 0. ( )$_{C,0}$ is an N-long vector, values of the target bit sequence of the C-long vector are obtained from a corresponding bit sequence of ( ), and values at all other positions are 0. The transmit device may determine an encoded code block, and $c_1^N = \widetilde{c_1^N} + m_1^N$. The transmit device may repeatedly perform the foregoing operations on $2^{nd}$ to $N^{th}$ code blocks, to obtain N encoded code blocks.

One of ordinary skill in the art would understand that the one-to-one correspondence in embodiments of this application may be one of the following: sequentially the same, the same after sequential reversal, or the same after interleaving. For example, when the one-to-one correspondence is sequentially the same, the transmit device may perform the foregoing operations, so that values of a target bit sequence are in a one-to-one correspondence with values of a source bit sequence. For another example, when the one-to-one correspondence is the same after interleaving, the transmit device may first interleave a source bit sequence, then determine a mask bit sequence of the source bit sequence, and perform the foregoing operations, so that values of a target bit sequence are in a one-to-one correspondence with values of the source bit sequence. An interleaved source bit sequence may be any one of a pseudo random sequence, a reversed sequence, or a bit reversed and interleaved sequence.

Figure 5A:
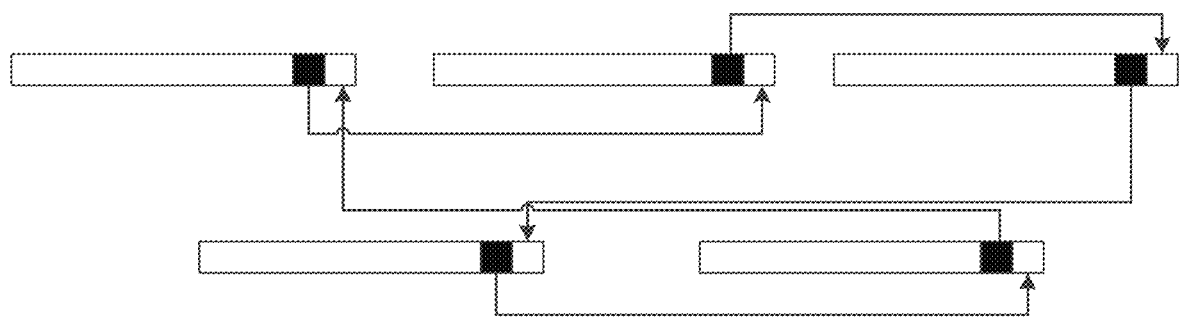
FIG. 5A is a schematic diagram of tail-biting coupling according to at least one embodiment of this application.
Figure 5B:
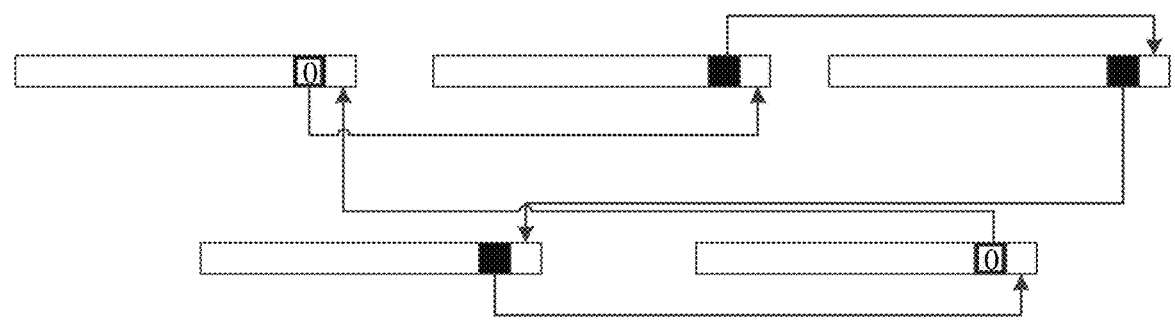
FIG. 5B is a schematic diagram of tail-biting coupling according to at least one embodiment of this application.

In embodiments of this application, the $1^{st}$ code block may also include a target bit sequence. The target bit sequence may be determined based on a source bit sequence segment or a source bit sequence of the last code block. Refer to FIG. 5A. The transmit device may determine five code blocks. A target bit sequence of a $1^{st}$ code block may be determined based on a source bit sequence of a last code block. A target bit sequence of a $2^{nd}$ code block may be determined based on a source bit sequence of the $1^{st}$ code block. A target bit sequence of a $3^{rd}$ code block may be determined based on a source bit sequence of the $2^{nd}$ code block. Optionally, refer to FIG. 5B. Values of a target bit sequence of a $1^{st}$ code block may be the same as values of a source bit sequence of a last code block, and all are 0. A target bit sequence of a $2^{nd}$ code block may be determined based on a source bit sequence of the $1^{st}$ code block. A target bit sequence of a $3^{rd}$ code block may be determined based on a source bit sequence of the $2^{nd}$ code block.

Figure 6:
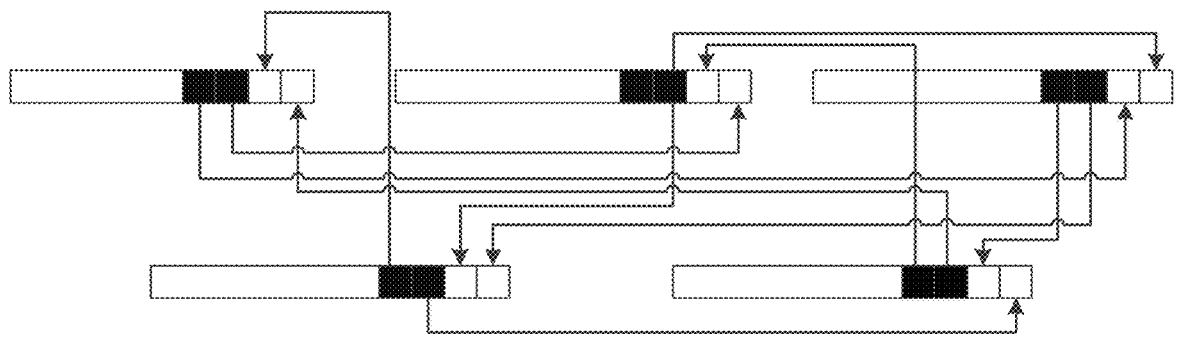
FIG. 6 is a schematic diagram of tail-biting coupling according to at least one embodiment of this application.

For example, M is equal to 2. Refer to FIG. 6. A $1^{st}$ code block may include two target bit sequences, and the two target bit sequence may be determined based on one source bit sequence segment of a $4^{th}$ code block and one source bit sequence segment of a last code block. A $2^{nd}$ code block may include two target bit sequences, and the two target bit sequence may be determined based on one source bit sequence segment of the last code block and one source bit sequence segment of the $1^{st}$ code block. A $3^{rd}$ code block may include two target bit sequences, and the two target bit sequence may be determined based on one source bit sequence segment of the $1^{st}$ code block and one source bit sequence segment of the $2^{nd}$ code block. The last code block may include two target bit sequences, and the two target bit sequence may be determined based on one source bit sequence segment of the $2^{nd}$ code block and one source bit sequence segment of the $3^{rd}$ code block. One of ordinary skill in the art would understand that a correspondence between a source bit sequence segment and a target bit sequence in FIG. 6 is merely an example, and is not used as a limitation on the correspondence between a source bit sequence segment and a target bit sequence.

Figure 7:
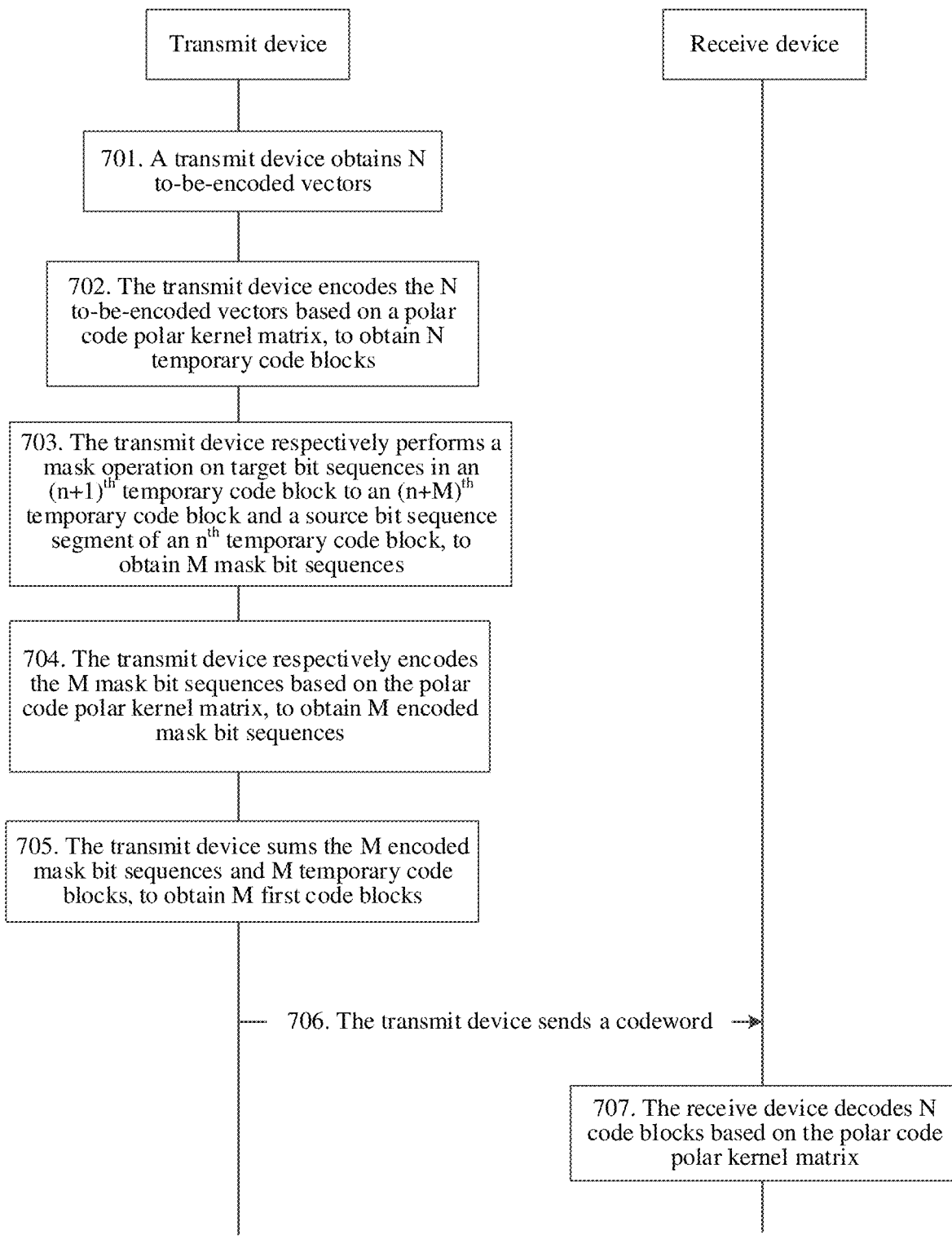
FIG. 7 is an example flowchart of an encoding and decoding manner according to at least one embodiment of this application.

FIG. 7 is an example flowchart of an encoding and decoding method according to at least one embodiment of this application, which may include the following steps.

Step 701: A transmit device obtains N to-be-encoded vectors.

Each to-be-encoded vector may include an information bit and a frozen bit. The transmit device may determine positions of Y to-be-encoded bits based on reliability of Y subchannels corresponding to the Y to-be-encoded bits, to determine a to-be-encoded vector. The transmit device may select, from a plurality of subchannels corresponding to the Y to-be-encoded bits, positions corresponding to Y subchannels with highest reliability. After the positions of the Y subchannels are determined, to-be-encoded bits are filled in the positions of the Y subchannels as information bits, and frozen bits are filled in other positions, to obtain a to-be-encoded vector. The to-be-encoded vector may include Y' bits, and the Y' bits may include Y information bits and Y'-Y frozen bits. Y is a positive integer and is less than or equal to Y', and Y' is a positive integer.

For example, in at least one embodiment an encoding length is 8, and a quantity of to-be-encoded bits is 4. Assuming that subchannels with highest reliability in eight subchannels are a subchannel 3, a subchannel 5, a subchannel 7, and a subchannel 8, positions corresponding to the subchannel 3, the subchannel 5, the subchannel 7, and the subchannel 8 are used to carry information bits, and other subchannels are used to carry frozen bits. In this case, a to-be-encoded sequence may be a 00101011. 1 represents an information bit, and 0 represents a frozen bit.

Step 702: The transmit device encodes the N to-be-encoded vectors based on a polar kernel matrix, to obtain N temporary code blocks.

The transmit device may perform polar encoding on a to-be-encoded vector $u_1^N$ to obtain a temporary code block $\widetilde{c_1^N} = u_1^N G_N$.

Step 703: The transmit device respectively performs a mask operation on target bit sequences in an $(n+1)^{th}$ temporary code block to an $(n+M)^{th}$ temporary code block and a source bit sequence segment of an $n^{th}$ temporary code block, to obtain M mask bit sequences.

M is greater than or equal to 1 and is less than or equal to N−1, n is greater than or equal to 1 and is less than or equal to N−M, n=1, 2, 3, . . . , N−M, and N is greater than or equal to 2. The transmit device may divide a source bit sequence of the $n^{th}$ temporary code block into M segments. When dividing the source bit sequence into M segments, the transmit device may evenly divide the source bit sequence into M equal segments, or may not evenly divide the source bit sequence into M equal segments, but divide the source bit sequence into M segments, where each source bit sequence segment includes one or more bits.

The transmit device may perform a mask operation on the target bit sequences and the source bit sequence segments. A mask bit sequence in each of the $(n+1)^{th}$ to $(n+M)^{th}$ temporary code blocks is $m_C = (\widetilde{c_C} + \overrightarrow{c_C})$. $\widetilde{c_C}$ may be a target bit sequence in a current temporary code block, and $\overrightarrow{c_C}$ may be a source bit sequence segment in the $n^{th}$ temporary code block.

Step 704: The transmit device respectively encodes the M mask bit sequences based on the polar kernel matrix, to obtain M encoded mask bit sequences.

An encoded mask bit sequence is $m_1^N = (m_{C,0} G_N)_{C,0} G_N$.

Step 705: The transmit device sums the M encoded mask bit sequences and M temporary code blocks, to obtain M first code blocks.

An $M^{th}$ first code block is obtained by summing an $M^{th}$ encoded mask bit sequence and the $(n+M)^{th}$ temporary code block. The M temporary code blocks include the $(n+1)^{th}$ temporary code block to the $(n+M)^{th}$ temporary code block.

The first code block is $c_1^N = \widetilde{c_1^N} + m_1^N$. One of ordinary skill in the art would understand that, values of target bit sequences in the M first code blocks may respectively correspond to values of the M source bit sequence segments in the $n^{th}$ temporary code block. For example, values of a target bit sequence in the $M^{th}$ first code block may be in a one-to-one correspondence with values of an $M^{th}$ source bit sequence segment. For another example, values of a target bit sequence in the $M^{th}$ first code block may be in a one-to-one correspondence with values of a $1^{st}$ source bit sequence segment.

In at least one implementation, a source bit sequence segment located more behind is coupled to a closer-spaced code block, and values of a target bit sequence located more ahead in the closer-spaced code block are in a one-to-one correspondence with values of the source bit sequence segment located more behind. A $1^{st}$ code block may include three source bit sequence segments. Values of a $3^{rd}$ source bit sequence segment may be in a one-to-one correspondence with values of a $3^{rd}$ target bit sequence in a $2^{nd}$ code block. Values of a $2^{nd}$ source bit sequence segment may be in a one-to-one correspondence with values of a $2^{nd}$ target bit sequence in a $3^{rd}$ code block. Values of a $1^{st}$ source bit sequence segment may be in a one-to-one correspondence with values of a $1^{st}$ target bit sequence in a $4^{th}$ code block. For source bit sequence segments in the $2^{nd}$ code block, the $3^{rd}$ code block, and the $4^{th}$ code block, refer to the correspondences between the source bit sequence segments in the $1^{st}$ code block and the target bit sequences in the $2^{nd}$ to $4^{th}$ code blocks. Details are not described herein.

Step 706: The transmit device sends a codeword.

The codeword may include N code blocks, and the N code blocks may include the M first code blocks and N−M second code blocks. The second code blocks herein may be code blocks in the N temporary code blocks other than the M temporary code blocks.

In at least one implementation, the transmit device may not send the target bit sequences. Refer to FIG. 8. The transmit device may send five code blocks. ui, uj, and uk in each code block may not be sent.

Step 707: A receive device decodes the N code blocks based on the polar kernel matrix.

Target bit sequences in $(n+1)^{th}$ to $(n+M)^{th}$ decoded code blocks are obtained based on M source bit sequence segments included in an $n^{th}$ decoded code block. One of ordinary skill in the art would understand that a target bit sequence of each of the $(n+1)^{th}$ to $(n+M)^{th}$ code blocks may be obtained based on one of the M source bit sequence segments included in the $n^{th}$ decoded code block. For example, a target bit sequence in the $(n+1)^{th}$ code block may be obtained based on a $1^{st}$ source bit sequence segment in the M source bit sequence segments included in the $n^{th}$ decoded code block, and a target bit sequence in the $(n+M)^{th}$ code block may be obtained based on an $M^{th}$ source bit sequence segment in the M decoded source bit sequence segments.

One of ordinary skill in the art would understand that, the source bit sequence and the target bit sequence may be bit sequences at preset positions. The transmit device may indicate the preset positions to the receive device, or the receive device may indicate the preset positions to the transmit device, or the transmit device may agree on the preset positions with the receive device, or the preset positions may be specified in a communications protocol. This is not specifically limited in this application. The following describes a principle of selecting the preset positions.

Refer to FIG. 9. The transmit device may determine a plurality of to-be-deleted rows and columns in the polar kernel matrix. A $1^{st}$ to-be-deleted column is a last column of the polar kernel matrix, and a $1^{st}$ to-be-deleted row is a row with a value 1 in the last column. As shown in FIG. 9, the $1^{st}$ to-be-deleted row is a $4^{th}$ row. $2^{nd}$ to $t^{th}$ to-be-deleted columns are columns whose column weight is 1, and $2^{nd}$ to $t^{th}$ to-be-deleted rows are rows with a value 1 in the columns whose column weight is 1. As shown in FIG. 9, the $2^{nd}$ to-be-deleted column is a $6^{th}$ row, and the $2^{nd}$ to-be-deleted column is a $2^{nd}$ row. By analogy, five to-be-deleted columns and rows in the polar kernel matrix may be found. The transmit device may determine to-be-deleted rows that are in the $n^{th}$ to-be-encoded vector and that correspond to the plurality of to-be-deleted rows in the polar kernel matrix. For example, as shown in FIG. 9, the to-be-deleted rows in the polar kernel matrix are 4, 2, 5, 8, 7, and 6. The transmit device may determine that the to-be-deleted rows in the $n^{th}$ to-be-encoded vector are 4, 2, 5, 8, 7, and 6. The transmit device may determine a target bit sequence and a source bit sequence from the to-be-deleted rows in the to-be-encoded vector.

A manner of selecting positions of the target bit sequence and the source bit sequence may include the following manner 1 to manner 4.

Manner 1: Reversed Shortening (RVS)+Bit-Reversed Shortening (BRS).

The transmit device and the receive device may select, in descending order of values of the to-be-deleted rows, C bits from the to-be-deleted rows as the source bit sequence, and select C bits from the to-be-deleted rows as the target bit sequence. For example, the transmit device and the receive device may select the first C consecutive bits as the source bit sequence, that is, BRS_seq[end–C+1:end]. Alternatively, the transmit device and the receive device may select the first C consecutive bits in ascending order of the values of the to-be-deleted rows as the source bit sequence. The transmit device and the receive device may select the first C consecutive bits in an order of the to-be-deleted row as the target bit sequence, that is, RVS_seq[end–C+1:end].

In at least one embodiment the source bit sequence includes three bits, and the target bit sequence also includes three bits. Refer to FIG. 9. The transmit device and the receive device may determine the $8^{th}$, $7^{th}$, and $6^{th}$ rows in the $n^{th}$ to-be-encoded vector as the source bit sequence. The transmit device and the receive device may determine the $4^{th}$, $2^{nd}$, and $5^{th}$ rows in the $n^{th}$ to-be-encoded vector as the target bit sequence.

Manner 2: Bit-Reversed Shortening (BRS).

The transmit device and the receive device may select, in an order of the to-be-deleted rows, C bits from the to-be-deleted rows as the source bit sequence, and select C bits from the to-be-deleted rows as the target bit sequence. For example, the transmit device and the receive device may select $(C+1)^{th}$ to $(2C)^{th}$ bits as the source bit sequence, that is, BRS_seq[end–2C+1:end–C]. Alternatively, the transmit device and the receive device may select $(C+1)^{th}$ to $(2C)^{th}$ bits in an order of the to-be-deleted rows as the source bit sequence. The transmit device and the receive device may select the first C bits in an order of the to-be-deleted rows as the target bit sequence, that is, BRS_seq[end–2+1:end].

In at least one embodiment the source bit sequence includes three bits, and the target bit sequence also includes three bits. Refer to FIG. 9, the transmit device and the receive device may determine the $5^{th}$, $8^{th}$, and $7^{th}$ rows in the $n^{th}$ to-be-encoded vector as the source bit sequence, and the $4^{th}$, $2^{nd}$, and $5^{th}$ rows as the target bit sequence. Optionally, the transmit device and the receive device may alternatively determine the $8^{th}$, $7^{th}$, and $6^{th}$ rows as the source bit sequence.

Manner 3: Reversed Shortening (RVS).

The transmit device and the receive device may select, in descending order of values of the to-be-deleted rows, C bits from the to-be-deleted rows as the source bit sequence, and select C bits from the to-be-deleted rows as the target bit sequence. For example, the transmit device and the receive device select $(C+1)^{th}$ to $(2C)^{th}$ bits as the source bit sequence, that is, RVS_seq[end–2C+1:end–C]. Alternatively, the transmit device and the receive device may select $(C+1)^{th}$ to $(2C)^{th}$ bits in descending order of the values of the to-be-deleted row as the source bit sequence. The transmit device and the receive device may select the first C consecutive bits in descending order of the values of the to-be-deleted rows as the target bit sequence, that is, RVS_seq[end–2+1:end].

In at least one embodiment the source bit sequence includes three bits, and the target bit sequence also includes three bits. Refer to FIG. 9, the transmit device and the receive device may determine the $6^{th}$, $5^{th}$, and $4^{th}$ rows in the $n^{th}$ to-be-encoded vector as the source bit sequence, and the $8^{th}$, $7^{th}$, and $6^{th}$ rows as the target bit sequence. Optionally, the transmit device and the receive device may alternatively determine the $5^{th}$, $4^{th}$, and $2^{nd}$ rows in the $n^{th}$ to-be-encoded vector as the source bit sequence.

Manner 4: Reversed Reliability Shortening (RRS).

The transmit device and the receive device may select, in descending order of reliability of subchannels corresponding to the to-be-deleted rows in the $n^{th}$ to-be-encoded vector, C bits from the to-be-deleted rows as the source bit sequence, and select C bits from the to-be-deleted rows as the target bit sequence. For example, the transmit device and the receive device select $C^{th}$ to $(2C)^{th}$ bits as the source bit sequence, that is, RRS_seq[end–2C+1:end–C]. Alternatively, the transmit device and the receive device may select $(C+1)^{th}$ to $(2C)^{th}$ bits in descending order of the reliability of the subchannels corresponding to the to-be-deleted rows in the $n^{th}$ to-be-encoded vector as the source bit sequence. The transmit device and the receive device use the first C bits in descending order of the reliability of the subchannels corresponding to the to-be-deleted rows in the $n^{th}$ to-be-encoded vector as the target bit sequence, that is, RRS_seq [end–2+1:end].

In at least one embodiment the source bit sequence includes three bits, and the target bit sequence also includes three bits. Refer to FIG. 9. The descending order of the reliability of the subchannels corresponding to the to-be-deleted rows may be 7, 8, 6, 2, 4, and 5. The transmit device and the receive device may determine the $6^{th}$, $2^{nd}$, and $4^{th}$ rows in the $n^{th}$ to-be-encoded vector as the source bit sequence, and the $7^{th}$, $8^{th}$, and $6^{th}$ rows as the target bit sequence. Optionally, the transmit device and the receive device may determine the $2^{nd}$, $4^{th}$, and $5^{th}$ rows in the $n^{th}$ to-be-encoded vector as the source bit sequence.

In at least one implementation, positions of a target bit sequence and a source bit sequence in a code block may overlap. Refer to FIG. 10. A source bit sequence and a target bit sequence of each code block overlap, and an overlapping part is in a size of one bit. It should be noted that, a quantity of bits in the overlapping part may be specified in a communications protocol, or indicated by the transmit device, or indicated by the receive device, or may be agreed on by the transmit device and the receive device. This is not specifically limited in this application.

In at least one implementation, the target bit sequence and the source bit sequence do not include a punctured bit, and/or the target bit sequence and the source bit sequence do not include a shortened bit. The $n^{th}$ to-be-encoded vector includes known P puncturing positions or S shortening positions. When selecting C bits as the source bit sequence and selecting C bits as the target bit sequence, the transmit device and the receive device may skip punctured bits and shortened bits until C bits are selected from the to-be-deleted rows as the source bit sequence, and C bits are selected from the to-be-deleted rows as the target bit sequence.

Figure 11:
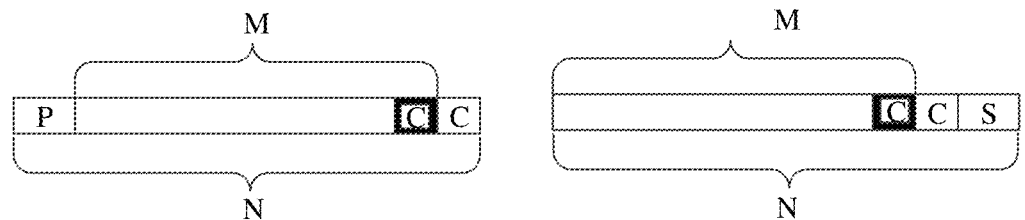
FIG. 11 is a schematic diagram of rate matching according to at least one embodiment of this application.

Refer to FIG. 11. One of ordinary skill in the art would understand that a length of a sent codeword is M, a mother code length is N, and a length of a source bit sequence and a length of a target bit sequence are C, and P puncturing positions or S shortening positions are known. If puncturing rate matching is used, P=N–M–C. If shortening rate matching is used, S=N–M–C.

The following describes a method for decoding the N code blocks by the receive device. The receive device may start decoding from a $1^{st}$ code block, or the receive device may start decoding from a last code block, or the receive device may start decoding from any code block between the $1^{st}$ code block and the last code block. The method for decoding the N code blocks by the receive device may include three methods, which are separately described below.

Method 1: Forward Decoding

Figure 12A:
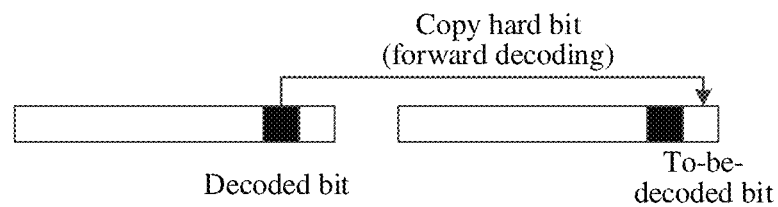
FIG. 12A is a schematic diagram of forward decoding according to at least one embodiment of this application.

Refer to FIG. 12A, a log-likelihood ratio (LLR) input of a decoder of an $(n+M)^{th}$ code block is set to $\{0\rightarrow+\infty, 1\rightarrow-\infty\}$ based on a bit value of a source bit sequence segment in a decoding result of an $n^{th}$ code block that has been successfully decoded, and then a polar decoder is invoked for decoding. For example, if a decoding result of the source bit sequence segment of the $n^{th}$ code block is [1, 0, 0, 1], an LLR at a corresponding position of a target bit sequence of the $(n+M)^{th}$ code block is initialized to [−∞, +∞, +∞, −∞] in the decoder.

Method 2: Independent Decoding

Figure 12B:
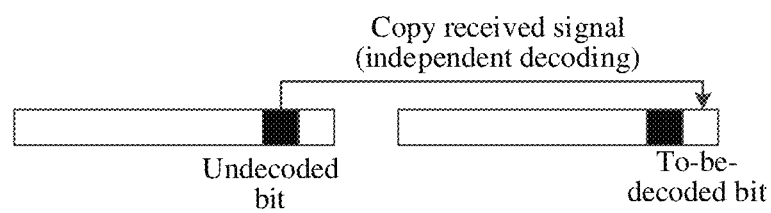
FIG. 12B is a schematic diagram of independent decoding according to at least one embodiment of this application.

Refer to FIG. 12B. A received signal or an LLR of a C-long target bit sequence of an $(n+M)^{th}$ code block is set to an LLR value of a source bit sequence segment in a received signal or an LLR of an $n^{th}$ code block, and then a polar decoder is invoked for decoding. For example, if an LLR of a source bit sequence segment of the $n^{th}$ code block is [−0.3, 0.1, 0.2, −0.4], an LLR at a corresponding position of a target bit sequence of the $(n+M)^{th}$ code block is initialized to [−0.3, 0.1, 0.2, −0.4] in a decoder.

Method 3: Backward Decoding

Figure 12C:
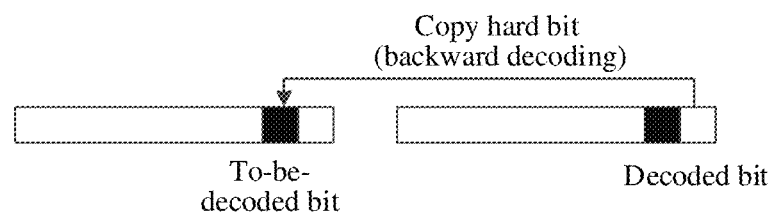
FIG. 12C is a schematic diagram of backward decoding according to at least one embodiment of this application.

Refer to FIG. 12C. An LLR at a corresponding position of a source bit sequence segment of an $n^{th}$ code block is set to a bit value at a corresponding position of a target bit sequence in a decoding result of an $(n+M)^{th}$ code block that has been successfully decoded, an LLR input of a decoder is set to {0→+∞, 1→−∞}, and then a polar decoder is invoked for decoding. For example, if a decoding result at a corresponding position of a target bit sequence of the $(n+M)^{th}$ code block is [1, 0, 0, 1], an LLR at a corresponding position of a source bit sequence segment of the $n^{th}$ code block is initialized to [−∞, +∞, +∞, −∞] in the decoder.

Optionally, the receive device may perform forward decoding based on an order of the code blocks by starting from the $1^{st}$ code block. If decoding of a $3^{rd}$ code block fails, independent decoding is performed on a $4^{th}$ code block. If the independent decoding on the $4^{th}$ code block fails, independent decoding may be performed on the $3^{rd}$ code block, and forward decoding is further performed based on the $3^{rd}$ decoded code block. If the independent decoding on the $3^{rd}$ code block fails, a decoding error event is declared. If the independent decoding on the $4^{th}$ code block succeeds, backward decoding is performed on the $3^{rd}$ code block. If the backward decoding on the $3^{rd}$ code block fails, a decoding error event is declared. If the backward decoding on the $3^{rd}$ code block succeeds, forward decoding may be performed based on the $4^{th}$ decoded code block until decoding ends.

Figure 13:
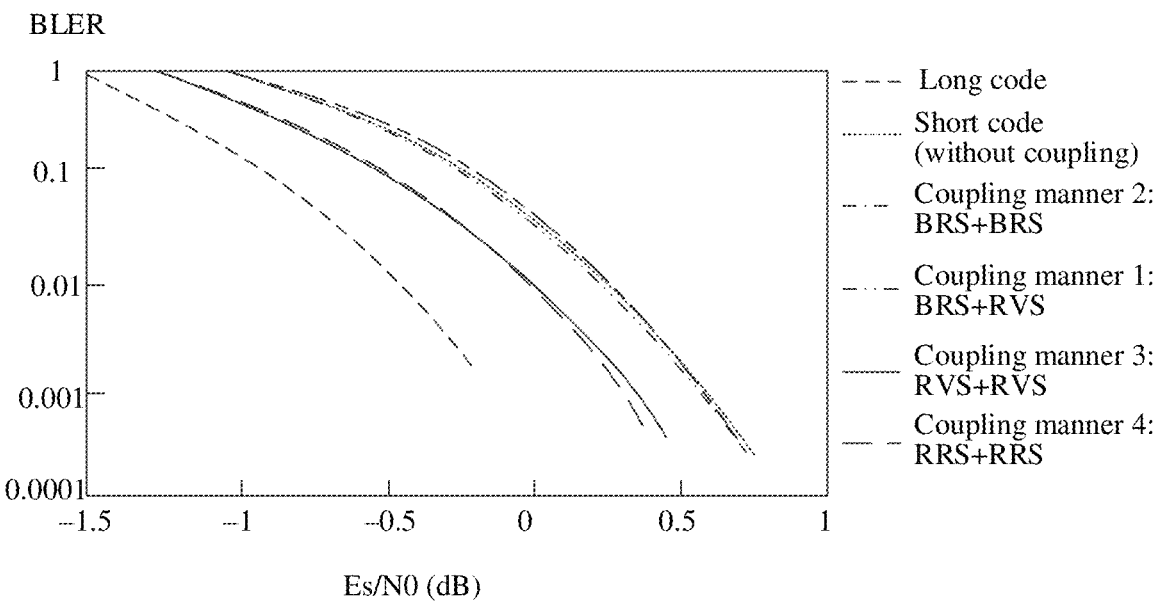
FIG. 13 is a schematic diagram of simulation results according to at least one embodiment of this application.

Based on the foregoing method, some bits between code blocks may be coupled, to obtain an encoding gain and improve encoding performance. In addition, complexity of the foregoing method is N, so that encoding complexity can be reduced. Moreover, decoding can be performed during receiving, and both complexity and delay are relatively low. Besides, in this embodiment of this application, no additional spectrum resource consumption and signaling overheads are added, and dependence on HARQ or outer erasure codes may be reduced. It is assumed that a reliability sequence used for polar code construction is a PW sequence, a code rate ranges from ⅓ to ⅚, and a coupling length is C=alpha*K, where alpha ranges from 0.025 to 0.3. The following simulation results are obtained by using this parameter set. K is a constant. Refer to FIG. 13. A codeword length M is 7584, a mother code length N is 8192, K is 2703, a horizontal axis represents a signal-to-noise ratio (SNR), and a vertical axis represents a block error rate (BLER). It can be learned from FIG. 13, a block error rate of a long code is the lowest. Besides, block error rates of RVS+RVS in the coupling manner 3 and RRS+RRS in the coupling manner 4 are higher than the block error rate of the long code, and block error rates of the coupling manner 3 and the coupling manner 4 are close. In addition, block error rates of BRS+BRS in the coupling manner 2, BRS+RVS in the coupling manner 1, and a short code without coupling are the highest, and the block error rates of the three are close. One of ordinary skill in the art would understand that complexity of the long code is the highest, complexity of the four coupling manners provided in this embodiment of this application is similar to each other, and is lower than the complexity of the long code, and complexity of the short code without coupling is the lowest. In conclusion, one of ordinary skill in the art would understand that in the coupling manner 3 and the coupling manner 4 provided in this embodiment of this application, a block error rate is relatively low, complexity is relatively low, and a relatively high encoding/decoding gain can be obtained.

Figure 14:
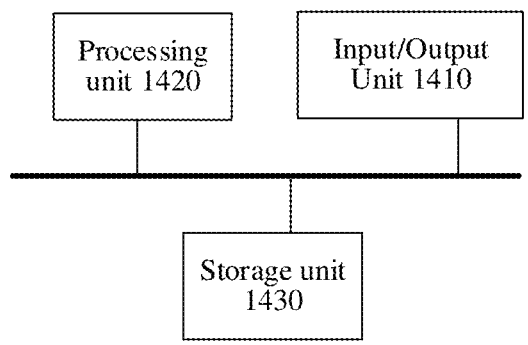
FIG. 14 is a schematic diagram of an apparatus with a communications function according to at least one embodiment of this application.

Based on a same technical concept as the foregoing method, as shown in FIG. 14, an apparatus 1400 is provided. The apparatus 1400 may include a processing unit 1420 and an input/output unit 1410. Optionally, the apparatus further includes a storage unit 1430. The processing unit 1420 may be connected to the storage unit 1430 and the input/output unit 1410, and the storage unit 1430 may also be connected to the input/output unit 1410. The processing unit 1420 may be integrated with the storage unit 1430. The input/output unit 1410 may also be referred to as a transceiver, a transceiver machine, a transceiver apparatus, or the like. The processing unit 1420 may also be referred to as a processor, a processing board, a processing module, a processing apparatus, or the like. Optionally, a component that is in the input/output unit 1410 and that is configured to implement a receiving function may be considered as a receiving unit, and a component that is in the input/output unit 1410 and that is configured to implement a sending function may be considered as a sending unit, that is, the input/output unit 1410 includes a receiving unit and a sending unit. The input/output unit sometimes may also be referred to as a transceiver machine, a transceiver, a transceiver circuit, or the like. The receiving unit sometimes may also be referred to as a receiver machine, a receiver, a receive circuit, or the like. The sending unit sometimes may also be referred to as a transmitter machine, a transmitter, a transmit circuit, or the like.

One of ordinary skill in the art would understand that the input/output unit 1410 is configured to perform a sending operation and a receiving operation of the transmit device and the receive device in the foregoing method embodiment, and the processing unit 1420 is configured to perform other operations than the receiving and sending operations on the transmit device and the receive device in the foregoing method embodiment. For example, in an implementation, the input/output unit 1410 is configured to perform a sending operation of the transmit device and a receiving operation of the receive device that are shown in step 706 in FIG. 7, and/or the input/output unit 1410 is further configured to perform other receiving and sending steps of the transmit device and the receive device in embodiments of this application. The processing unit 1420 is configured to perform processing steps of the transmit device that are shown in step 701 to step 705 in FIG. 7 and processing operations of the receive device that are shown in step 707, and/or the processing unit 1420 is configured to perform other processing steps of the transmit device and the receive device in embodiments of this application.

One of ordinary skill in the art would understand that the apparatus shown in this embodiment of this application may perform the technical solutions shown in the foregoing method embodiment. Implementation principles and beneficial effects of the apparatus are similar thereto, and details are not described herein again.

The storage unit 1430 is configured to store a computer program.

For example, when the apparatus 1400 is configured to perform steps performed by the transmit device, the processing unit is configured to obtain N to-be-encoded vectors. The processing unit 1420 is further configured to encode the N to-be-encoded vectors based on a polar code kernel matrix, to obtain N temporary code blocks. The processing unit 1420 is further configured to respectively perform a mask operation on target bit sequences in an $(n+1)^{th}$ temporary code block to an $(n+M)^{th}$ temporary code block and a source bit sequence segment of an $n^{th}$ temporary code block, to obtain M mask bit sequences. M is greater than or equal to 1 and is less than or equal to N−1, the target bit sequences are sub-sequences of the $(n+1)^{th}$ temporary code block to the $(n+M)^{th}$ temporary code block, a source bit sequence is a sub-sequence of the $n^{th}$ temporary code block, the source bit sequence segment is a sub-sequence of the source bit sequence, the source bit sequence segment is one of M source bit sequence segments, n is greater than or equal to 1 and is less than or equal to N− M, N is greater than or equal to 2, and n=1, 2, 3, . . . , N−M. The processing unit 1420 is further configured to respectively encode the M mask bit sequences based on the polar kernel matrix, to obtain M encoded mask bit sequences. The processing unit 1420 is further configured to sum the M encoded mask bit sequences and M temporary code blocks, to obtain M first code blocks. An $M^{th}$ first code block is obtained by summing an $M^{th}$ encoded mask bit sequence and the $(n+M)^{th}$ temporary code block, and the M temporary code blocks include the $(n+1)^{th}$ temporary code block to the $(n+M)^{th}$ temporary code block. The input/output unit 1410 is further configured to send a codeword. The codeword includes N code blocks, the N code blocks include the M first code blocks and N−M second code blocks, and the second code blocks are code blocks in the N temporary code blocks other than the M temporary code blocks. For related descriptions of the target bit sequence, the source bit sequence, and the source bit sequence segment, refer to the method embodiment shown in FIG. 7. Details are not described herein again.

In a design, the processing unit 1420 is further configured to: determine a plurality of to-be-deleted rows and columns in the polar kernel matrix, where a $1^{st}$ to-be-deleted column is a last column of the polar kernel matrix, a $1^{st}$ to-be-deleted row is a row with a value 1 in the last column of the polar kernel matrix, a $t^{th}$ to-be-deleted column is a column whose column weight is 1, and a $t^{th}$ to-be-deleted row is a row with a value 1 in the column whose column weight is 1; determine to-be-deleted rows that are in an $n^{th}$ to-be-encoded vector and that correspond to the plurality of to-be-deleted rows and columns; and determine a position of a target bit sequence and a position of a source bit sequence from the determined to-be-deleted rows in the $n^{th}$ to-be-encoded vector. t is greater than or equal to 1; For the to-be-deleted rows, the to-be-deleted columns, the position of the source bit sequence, and the position of the target bit sequence, refer to related descriptions in at least the method embodiment in FIG. 7. Details are not described herein again.

In a design, when sending the codeword, the input/output unit 1410 is specifically configured to: send the N code blocks. The target bit sequences are not sent.

For example, when the apparatus 1400 is configured to perform steps performed by the receive device, the input/output unit 1410 is configured to receive a codeword. The codeword includes N code blocks, the N code blocks include M first code blocks and N−M second code blocks, N is greater than or equal to 2, and M is greater than or equal to 1 and is less than or equal to N−1. The processing unit 1420 is configured to decode the N code blocks based on a polar code kernel matrix. Target bit sequences in $(n+1)^{th}$ to $(n+M)^{th}$ decoded code blocks are obtained based on M source bit sequence segments included in an $n^{th}$ decoded code block. For related descriptions of the source bit sequence, the source bit sequence segment, and the target bit sequence, refer to the method embodiment shown in FIG. 7. Details are not described herein again.

In a design, the processing unit 1420 is further configured to: determine a plurality of to-be-deleted rows and columns in the polar kernel matrix, where a $1^{st}$ to-be-deleted column is a last column of the polar kernel matrix, a $1^{st}$ to-be-deleted row is a row with a value 1 in the last column of the polar kernel matrix, a $t^{th}$ to-be-deleted column is a column whose column weight is 1, a $t^{th}$ to-be-deleted row is a row with a value 1 in the column whose column weight is 1, and t is greater than or equal to 1; determine to-be-deleted rows that are in the decoded $n^{th}$ code block and $(n+1)^{th}$ code block to $(n+M)^{th}$ code block and that correspond to the plurality of to-be-deleted rows and columns; and determine a position of a source bit sequence from the determined to-be-deleted rows of the $n^{th}$ decoded code block, and determine a position of a target bit sequence from the determined to-be-deleted rows of the decoded $n^{th}$ code block and $(n+1)^{th}$ code block. For the to-be-deleted rows, the to-be-deleted columns, the position of the source bit sequence, and the position of the target bit sequence, refer to related descriptions in the method embodiment shown in FIG. 7. Details are not described herein again.

Figure 15:
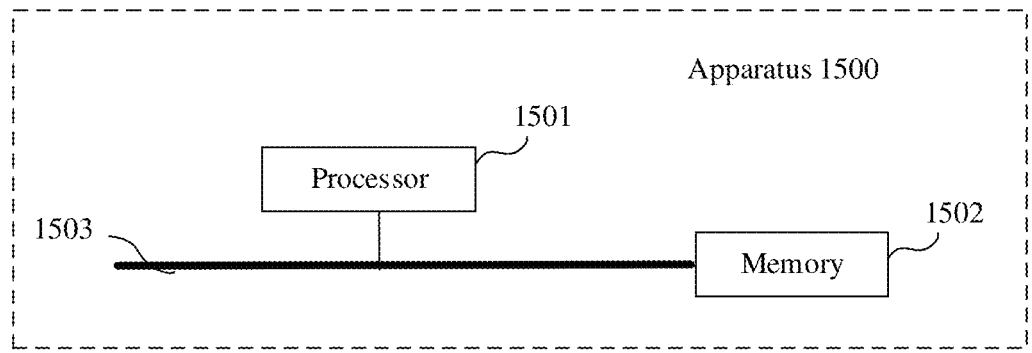
FIG. 15 is a schematic diagram of an encoding apparatus according to at least one embodiment of this application.

FIG. 15 is a schematic diagram of a hardware structure of an apparatus according to at least one embodiment of this application. The apparatus 1500 is configured to implement a function of the transmit device in the foregoing method. When the apparatus is configured to implement the function of the transmit device in the foregoing method, the apparatus may be the transmit device, may be a chip with a similar transmit device function, or may be an apparatus that can be used in matching with the transmit device. The apparatus 1500 includes: a processor 1501 and a memory 1502.

The memory 1502 is configured to store a computer program, and may be further configured to store intermediate data.

The processor 1501 is configured to execute the computer program stored in the memory, to implement steps in the foregoing encoding method. For details, refer to related descriptions in the foregoing method embodiment.

Optionally, the memory 1502 may be independent, or may be integrated with the processor 1501. In some implementations, the memory 1502 may even be located outside the encoding apparatus 1500.

When the memory 1502 is a component independent of the processor 1501, the encoding apparatus 1500 may further include a bus 1503, configured to connect the memory 1502 and the processor 1501.

Optionally, the apparatus 1500 may further include a transmitter. For example, the transmitter is configured to send encoded bits.

The apparatus 1500 provided in this embodiment may be a terminal device or a network device, and may be configured to perform the foregoing encoding method. Implementations and technical effects of the apparatus 1500 are similar thereto, and details are not described herein again in this embodiment.

Figure 16:
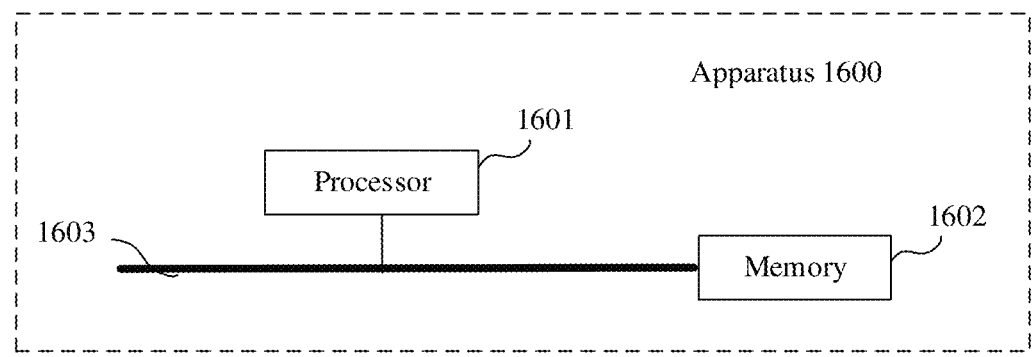
FIG. 16 is a schematic diagram of a decoding apparatus according to at least one embodiment of this application.

FIG. 16 is a schematic diagram of a hardware structure of an apparatus according to at least one embodiment of this application. The apparatus 1600 is configured to implement a function of the receive device in the foregoing method. When the apparatus is configured to implement the function of the receive device in the foregoing method, the apparatus may be the receive device, may be a chip with a similar receive device function, or may be an apparatus that can be used in matching with the receive device. The apparatus 1600 includes: a processor 1601 and a memory 1602.

The memory 1602 is configured to store a computer program, and may be further configured to store intermediate data.

The processor 1601 is configured to execute the computer program stored in the memory, to implement steps in the foregoing decoding method. For details, refer to related descriptions in the foregoing method embodiment.

Optionally, the memory 1602 may be independent, or may be integrated with the processor 1601. In some implementations, the memory 1602 may even be located outside the decoding apparatus 1600.

When the memory 1602 is a component independent of the processor 1601, the decoding apparatus 1600 may further include a bus 1603, configured to connect the memory 1602 and the processor 1601.

Optionally, the apparatus 1600 may further include a receiver. For example, the receiver is configured to receive encoded bits.

The apparatus 1600 provided in at least one embodiment may be a terminal device or a network device, and may be configured to perform the foregoing decoding method. Implementations and technical effects of the apparatus 1600 are similar thereto, and details are not described herein again in this embodiment.

Figure 17:
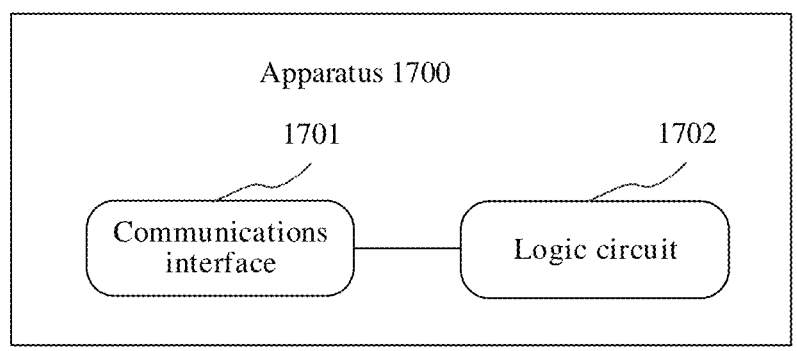
FIG. 17 is a schematic diagram of an encoding apparatus according to at least one embodiment of this application.

FIG. 17 is a schematic diagram of a structure of an apparatus according to an embodiment of this application. Refer to FIG. 17. The apparatus 1700 may include a communications interface 1701 and a logic circuit 1702.

The logic circuit 1702 is configured to: obtain N to-be-encoded vectors, and encode the N to-be-encoded vectors based on a polar code kernel matrix, to obtain N temporary code blocks. The logic circuit is further configured to: respectively perform a mask operation on target bit sequences in an $(n+1)^{th}$ temporary code block to an $(n+M)^{th}$ temporary code block and a source bit sequence segment of an $n^{th}$ temporary code block, to obtain M mask bit sequences; and respectively encode the M mask bit sequences based on the polar kernel matrix, to obtain M encoded mask bit sequences. The logic circuit is further configured to sum the M encoded mask bit sequences and M temporary code blocks, to obtain M first code blocks. The communications interface is configured to output a codeword.

Optionally, the communications interface 1701 may have a function of the input/output unit 1410 in the embodiment of FIG. 14. The logic circuit 1702 may have a function of the processing unit 1420 in the embodiment of FIG. 14.

Optionally, the logic circuit 1702 may have a function of the processor 1501 in the embodiment of FIG. 15. The logic circuit 1702 may further perform another step in the encoding method.

The apparatus 1700 provided in this embodiment of this application may perform the technical solutions shown in the foregoing method embodiment. Implementation principles and beneficial effects of the apparatus 1700 are similar thereto, and details are not described herein again.

Figure 18:
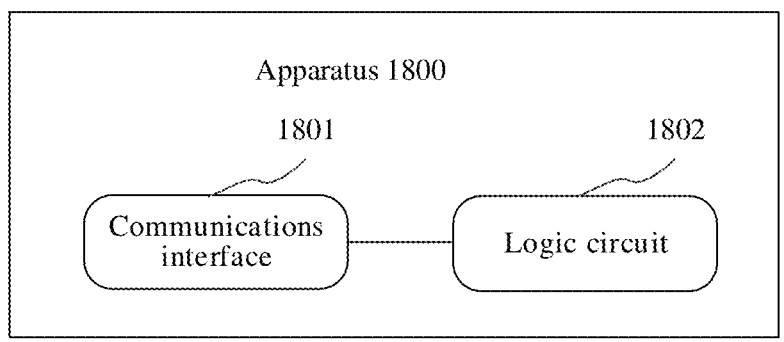
FIG. 18 is a schematic diagram of a decoding apparatus according to at least one embodiment of this application.

FIG. 18 is a schematic diagram of a structure of another apparatus according to at least one embodiment of this application. Refer to FIG. 18. The apparatus 1800 may include a communications interface 1801 and a logic circuit 1802.

The communications interface 1801 is configured to input a codeword. The codeword includes N code blocks, the N code blocks include M first code blocks and N−M second code blocks, N is greater than or equal to 2, and M is greater than or equal to 1 and is less than or equal to N−1. The logic circuit 1802 is configured to decode the N code blocks based on a polar code kernel matrix.

Optionally, the communications interface 1801 may have a function of the input/output unit 1410 in the embodiment of FIG. 14. The logic circuit 1802 may have a function of the processing unit 1420 in the embodiment of FIG. 14.

Optionally, the communications interface 1801 may have a function of the receiver in the embodiment of FIG. 16. The logic circuit 1802 may have a function of the processor 1601 in the embodiment of FIG. 16. The logic circuit 1802 may further perform another step in the decoding method.

Optionally, the communications interface 1801 may further output a decoding result.

The apparatus 1800 provided in this embodiment of this application may perform the technical solutions shown in the foregoing method embodiment. Implementation principles and beneficial effects of the apparatus 1800 are similar thereto, and details are not described herein again.

In at least one form of embodiments, a computer-readable storage medium is provided. The computer-readable storage medium stores instructions. When the instructions are executed, the method of the transmit device and/or the receive device in the foregoing method embodiment is performed.

In at least one form of embodiments, a computer program product including instructions is provided. When the instructions are executed, the method of the transmit device and/or the receive device in the foregoing method embodiment is performed.

In at least one form of embodiments, a communications system is provided. The system may include at least one transmit device described above and at least one receive device described above.

One of ordinary skill in the art would understand that the processor mentioned in embodiments of the present invention may be a central processing unit (CPU), or may be another general-purpose processor, a digital signal processor (DSP), an application-specific integrated circuit (ASIC), a field programmable gate array (FPGA) or another programmable logic device, a discrete gate, a transistor logic device, a discrete hardware component, or the like. The general-purpose processor may be a microprocessor, or the processor may be any conventional processor or the like.

One of ordinary skill in the art would understand that the memory mentioned in the embodiments of the present invention may be a volatile memory or a non-volatile memory, or may include both a volatile memory and a non-volatile memory. The non-volatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM), and is used as an external cache. Through example but not limitative description, many forms of RAMs may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchronous link dynamic random access memory (SLDRAM), and a direct rambus dynamic random access memory (DR RAM).

One of ordinary skill in the art would understand that when the processor is the general-purpose processor, the DSP, the ASIC, the FPGA or another programmable logic device, the discrete gate, the transistor logic device, or the discrete hardware component, the memory (storage module) is integrated into the processor.

One of ordinary skill in the art would understand that the memory described in this specification aims to include but is not limited to these memories and any memory of another appropriate type.

One of ordinary skill in the art would understand that in embodiments of this application, sequence numbers of the foregoing processes do not mean particular execution sequences. The execution sequences of the processes should be determined based on functions and internal logic of the processes, and should not be construed as any limitation on the implementation processes of the embodiments of the present invention.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

A person skilled in the art would understand that, for the purpose of convenient and brief description, for a detailed working process of the foregoing system, apparatus, and unit, refer to a corresponding process in the foregoing method embodiments. Details are not described herein again.

In the several embodiments provided in this application, one of ordinary skill in the art would understand that the disclosed system, apparatus, and method may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communications connections may be implemented through some interfaces. The indirect couplings or communications connections between the apparatuses or units may be implemented in electronic, mechanical, or other forms.

The units described as separate parts may or may not be physically separate, and parts displayed as units may or may not be physical units, may be located at one position, or may be distributed on a plurality of network units. Some or all of the units may be selected based on actual requirements to achieve the objectives of the solutions of embodiments.

In addition, functional units in embodiments of this application may be integrated into one processing unit, each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of this application essentially, or a part contributing to a conventional technology, or some of the technical solutions may be implemented in a form of a software product. The software product is stored in a storage medium, and includes several instructions for instructing a computer device (which may be a personal computer, a server, or a network device) to perform all or some of the steps of the methods described in embodiments of this application. The storage medium includes various media that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An encoding method, comprising:
obtaining, by a transmit device, N to-be-encoded vectors;
encoding, by the transmit device, the N to-be-encoded vectors based on a polar code kernel matrix, to obtain N temporary code blocks;
performing, by the transmit device, a mask operation on each target bit sequence of target bit sequences in an $(n+1)^{th}$ temporary code block to an $(n+M)^{th}$ temporary code block and a source bit sequence segment of an $n^{th}$ temporary code block, to obtain M mask bit sequences, wherein M is greater than or equal to 1 and is less than or equal to N−1, the target bit sequences are sub-sequences of the $(n+1)^{th}$ temporary code block to the $(n+M)^{th}$ temporary code block, a source bit sequence is a sub-sequence of the $n^{th}$ temporary code block, the source bit sequence segment is a sub-sequence of the source bit sequence, the source bit sequence segment is one of M source bit sequence segments, n is greater than or equal to 1 and is less than or equal to N−M, N is greater than or equal to 2, and n=1, 2, 3, . . . , N−M;
encoding, by the transmit device, each of the M mask bit sequences based on the polar kernel matrix, to obtain M encoded mask bit sequences;
summing, by the transmit device, the M encoded mask bit sequences and M temporary code blocks, to obtain M first code blocks, wherein an $M^{th}$ first code block is obtained by summing an $M^{th}$ encoded mask bit sequence and the $(n+M)^{th}$ temporary code block, and the M temporary code blocks comprise the $(n+1)^{th}$ temporary code block to the $(n+M)^{th}$ temporary code block; and
sending, by the transmit device, a codeword, wherein the codeword comprises N code blocks, the N code blocks comprise the M first code blocks and N−M second code blocks, and the second code blocks are code blocks in the N temporary code blocks other than the M temporary code blocks.

2. The method according to claim 1, wherein values of a target bit sequence of the $(n+M)^{th}$ code block in the N code blocks are in a one-to-one correspondence with values of a source bit sequence segment in the $n^{th}$ code block, the $(n+M)^{th}$ code block is one of the first code blocks, and the $n^{th}$ code block is one of the second code blocks.

3. The method according to claim 2, wherein a value of each of a target bit sequence of a $1^{st}$ code block in the N code blocks is in a one-to-one correspondence with a value of each of an $M^{th}$ source bit sequence segment of M source bit sequences in a last code block in the N code blocks.

4. The method according to claim 2, wherein the one-to-one correspondence is one of the following: sequentially the same, the same after sequential reversal, or the same after interleaving.

5. The method according to claim 1, wherein a quantity of bits in the target bit sequence is equal to a quantity of bits in the source bit sequence segment.

6. The method according to claim 1, wherein the target bit sequence comprises at least one non-zero element.

7. The method according to claim 1, further comprising:
determining, by the transmit device, a plurality of to-be-deleted rows and columns in the polar kernel matrix, wherein a $1^{st}$ to-be-deleted column is a last column of the polar kernel matrix, a $1^{st}$ to-be-deleted row is a row with a value 1 in the last column of the polar kernel matrix, a $t^{th}$ to-be-deleted column is a column whose column weight is 1, and a $t^{th}$ to-be-deleted row is a row with a value 1 in the column whose column weight is 1;
determining, by the transmit device, to-be-deleted rows that are in an $n^{th}$ to-be-encoded vector and that correspond to the plurality of to-be-deleted rows and columns; and
determining, by the transmit device, a position of a target bit sequence and a position of a source bit sequence from the determined to-be-deleted rows in the $n^{th}$ to-be-encoded vector, wherein t is greater than or equal to 1.

8. The method according to claim 7, wherein the determining, by the transmit device, the position of the target bit sequence and the position of the source bit sequence from the determined to-be-deleted rows in the $n^{th}$ to-be-encoded vector comprises:
sorting, by the transmit device, the to-be-deleted rows in the $n^{th}$ to-be-encoded vector based on a deletion order of the to-be-deleted rows in the $n^{th}$ to-be-encoded vector, and selecting, by the transmit device, C consecutive positions from front to back as the position of the target bit sequence;
sorting, by the transmit device, the to-be-deleted rows in the $n^{th}$ to-be-encoded vector in descending order of row values, and selecting, by the transmit device, C consecutive positions from front to back as the target bit sequence;
sorting, by the transmit device, the to-be-deleted rows in the $n^{th}$ to-be-encoded vector in descending order based on reliability of corresponding subchannels, and selecting, by the transmit device, $(C+1)^{th}$ to $(2C)^{th}$ consecutive positions from front to back as the source bit sequence;
sorting, by the transmit device, the to-be-deleted rows in the $n^{th}$ to-be-encoded vector based on a deletion order of the to-be-deleted rows in the $n^{th}$ to-be-encoded vector, and selecting, by the transmit device, $(C+1)^{th}$ to $(2C)^{th}$ consecutive positions from front to back as the source bit sequence;
sorting, by the transmit device, the to-be-deleted rows in the $n^{th}$ to-be-encoded vector in descending order of row values, and selecting, by the transmit device, $(C+1)^{th}$ to $(2C)^{th}$ consecutive positions from front to back as the source bit sequence; or
sorting, by the transmit device, the to-be-deleted rows in the $n^{th}$ to-be-encoded vector in descending order based on reliability of corresponding subchannels, and selecting, by the transmit device, $(C+1)^{th}$ to $(2C)^{th}$ consecutive positions from front to back as the source bit sequence, wherein C is greater than or equal to 1.

9. The method according to claim 7, wherein the target bit sequence and the source bit sequence are free of a punctured bit or a shortened bit.

10. The method according to claim 1, wherein the sending, by the transmit device, the codeword comprises:
sending, by the transmit device, a bit sequence other than the target bit sequence in the N code blocks.

11. A decoding method, comprising:
receiving, by a receive device, a codeword, wherein the codeword comprises N code blocks, the N code blocks comprise M first code blocks and N−M second code blocks, N is greater than or equal to 2, and M is greater than or equal to 1 and is less than or equal to N−1; and
decoding, by the receive device, the N code blocks based on a polar code kernel matrix, wherein target bit sequences in $(n+1)^{th}$ to $(n+M)^{th}$ decoded code blocks are obtained based on M source bit sequence segments comprised in an $n^{th}$ decoded code block, a source bit sequence is a sub-sequence of the $n^{th}$ decoded code block, the source bit sequence segments are sub-sequences of the source bit sequence, the target bit sequences are sub-sequences of the $(n+1)^{th}$ to $(n+M)^{th}$ decoded code blocks, the $n^{th}$ decoded code block is obtained by decoding the first code blocks, the $(n+1)^{th}$ to $(n+M)^{th}$ decoded code blocks are obtained by decoding the second code blocks, n is greater than or equal to 1 and is less than or equal to N−M, and n=1, 2, 3, . . . , N−M.

12. The method according to claim 11, wherein a value of each of a target bit sequence of the $(n+M)^{th}$ decoded code block is in a one-to-one correspondence with a value of each of an $M^{th}$ source bit sequence segment in the M source bit sequence segments.

13. The method according to claim 12, wherein a value of each of a target bit sequence of a $1^{st}$ decoded code block is in a one-to-one correspondence with a value of each of an $M^{th}$ source bit sequence segment of M source bit sequences in a last decoded code block.

14. The method according to claim 12, wherein the one-to-one correspondence is one of the following: sequentially the same, the same after sequential reversal, or the same after interleaving.

15. The method according to claim 11, wherein a quantity of bits in the target bit sequence is equal to a quantity of bits in the source bit sequence segment.

16. The method according to claim 11, wherein the target bit sequence comprises at least one non-zero element.

17. The method according to claim 11, further comprising:
determining, by the receive device, a plurality of to-be-deleted rows and columns in the polar kernel matrix, wherein a $1^{st}$ to-be-deleted column is a last column of the polar kernel matrix, a $1^{st}$ to-be-deleted row is a row with a value 1 in the last column of the polar kernel matrix, a $t^{th}$ to-be-deleted column is a column whose column weight is 1, a $t^{th}$ to-be-deleted row is a row with a value 1 in the column whose column weight is 1, and t is greater than or equal to 1;

determining, by the receive device, to-be-deleted rows that are in the decoded $n^{th}$ code block and $(n+1)^{th}$ code block to $(n+M)^{th}$ code block and that correspond to the plurality of to-be-deleted rows and columns; and determining, by the receive device, a position of a source bit sequence from the determined to-be-deleted rows of the $n^{th}$ decoded code block, and determining a position of a target bit sequence from the determined to-be-deleted rows of the decoded $n^{th}$ code block and $(n+1)^{th}$ code block.

18. The method according to claim 17, wherein the determining, by the receive device, the position of the source bit sequence from the determined to-be-deleted rows of the $n^{th}$ decoded code block, and determining the position of a target bit sequence from the determined to-be-deleted rows of the decoded $n^{th}$ code block and $(n+1)^{th}$ code block comprises:

sorting, by the receive device, the to-be-deleted rows in the $n^{th}$ decoded code block based on a deletion order, and selecting, by the receive device, C consecutive positions from front to back as the position of the target bit sequence;

sorting, by the receive device, the to-be-deleted rows in descending order of row values, and selecting, by the receive device, C consecutive positions from front to back as the target bit sequence;

sorting, by the receive device, the to-be-deleted rows in descending order based on reliability of corresponding subchannels, and selecting, by the receive device, $(C+1)^{th}$ to $(2C)^{th}$ consecutive positions from front to back as the source bit sequence;

sorting, by the receive device, the to-be-deleted rows in the $n^{th}$ decoded code block based on a deletion order, and selecting, by the receive device, $(C+1)^{th}$ to $(2C)^{th}$ consecutive positions from front to back as the source bit sequence;

sorting, by the receive device, the to-be-deleted rows in descending order of row values, and selecting, by the receive device, $(C+1)^{th}$ to $(2C)^{th}$ consecutive positions from front to back as the source bit sequence; or sorting, by the receive device, the to-be-deleted rows in descending order based on reliability of corresponding subchannels, and selecting, by the receive device, $(C+1)^{th}$ to $(2C)^{th}$ consecutive positions from front to back as the source bit sequence, wherein C is greater than or equal to 1.

19. An encoding apparatus, comprising:
at least one processor; and
at least one memory having instructions stored thereon that, when executed by the at least one processor, cause the encoding apparatus to:

obtain N to-be-encoded vectors;

encode the N to-be-encoded vectors based on a polar code kernel matrix, to obtain N temporary code blocks;

perform a mask operation on each target bit sequence of target bit sequences in an $(n+1)^{th}$ temporary code block to an $(n+M)^{th}$ temporary code block and a source bit sequence segment of an $n^{th}$ temporary code block, to obtain M mask bit sequences, wherein M is greater than or equal to 1 and is less than or equal to N−1, the target bit sequences are sub-sequences of the $(n+1)^{th}$ temporary code block to the $(n+M)^{th}$ temporary code block, a source bit sequence is a sub-sequence of the $n^{th}$ temporary code block, the source bit sequence segment is a sub-sequence of the source bit sequence, the source bit sequence segment is one of M source bit sequence segments, n is greater than or equal to 1 and is less than or equal to N−M, N is greater than or equal to 2, and n=1, 2, 3, . . . , N−M;

encode each of the M mask bit sequences based on the polar kernel matrix, to obtain M encoded mask bit sequences;

sum the M encoded mask bit sequences and M temporary code blocks, to obtain M first code blocks, wherein an AP first code block is obtained by summing an $M^{th}$ mask bit sequence and the $(n+M)^{th}$ temporary code block, and the M temporary code blocks comprise the $(n+1)^{th}$ temporary code block to the $(n+M)^{th}$ temporary code block; and send a codeword, wherein the codeword comprises N code blocks, the N code blocks comprise the M first code blocks and N−M second code blocks, and the second code blocks are code blocks in the N temporary code blocks other than the M temporary code blocks.

20. The apparatus according to claim 19, wherein a value of each of a target bit sequence of the $(n+M)^{th}$ code block in the N code blocks is in a one-to-one correspondence with a value of each of a source bit sequence segment in the $n^{th}$ code block, the $(n+M)^{th}$ code block is one of the first code blocks, and the $n^{th}$ code block is one of the second code blocks.

* * * * *